US009010908B2

(12) United States Patent
Horiguchi et al.

(10) Patent No.: US 9,010,908 B2
(45) Date of Patent: Apr. 21, 2015

(54) LIQUID JET HEAD, LIQUID JET APPARATUS, AND METHOD OF MANUFACTURING LIQUID JET HEAD

(71) Applicant: SII Printek Inc., Chiba (JP)

(72) Inventors: Satoshi Horiguchi, Chiba (JP); Yuzuru Kubota, Chiba (JP)

(73) Assignee: SII Printek Inc. (JP)

( * ) Notice: Subject to any disclaimer, the term of this patent is extended or adjusted under 35 U.S.C. 154(b) by 0 days.

(21) Appl. No.: 14/099,434

(22) Filed: Dec. 6, 2013

(65) Prior Publication Data

US 2014/0168320 A1 Jun. 19, 2014

(30) Foreign Application Priority Data

Dec. 13, 2012 (JP) ................................ 2012-272539

(51) Int. Cl.

*B41J 2/045* (2006.01)
*H01L 41/22* (2013.01)
*B41J 2/16* (2006.01)
*B41J 2/14* (2006.01)

(52) U.S. Cl.

CPC .............. *B41J 2/164* (2013.01); *B41J 2/14209* (2013.01); *B41J 2/1609* (2013.01); *B41J 2/1626* (2013.01); *B41J 2/1631* (2013.01); *B41J 2/1632* (2013.01); *B41J 2202/12* (2013.01)

(58) Field of Classification Search

CPC ............ B41J 2/14; B41J 2/164; B41J 2/1607; B41J 2/1609; B41J 2/04581; B41J 2202/11; B41J 2/14201; B41J 1/145
USPC ................................ 347/54, 68–72; 29/25.35
See application file for complete search history.

(56) References Cited

U.S. PATENT DOCUMENTS 6,830,319 B2 * 12/2004 Harajiri et al. .................. 347/68
7,614,128 B2 * 11/2009 Kamei ......................... 29/25.35
8,651,631 B2 * 2/2014 Koseki ............................ 347/71
2007/0026561 A1 2/2007 Kamei ............................ 438/50

FOREIGN PATENT DOCUMENTS

| | | |
|---|---|---|
| EP | 0799700 | 10/1997 |
| EP | 0839654 | 5/1998 |
| EP | 2540503 | 1/2013 |
| GB | 2497869 | 6/2013 |
| JP | 2011104791 | 6/2001 |
| JP | 2002225268 | 8/2002 |
| JP | 2011104791 | 6/2011 |

OTHER PUBLICATIONS

IPO Search Report mailed Jun. 10, 2014 issued in Appln. No. GB1321974.6.

* cited by examiner

*Primary Examiner* — An Do
(74) *Attorney, Agent, or Firm* — Adams & Wilks

(57) ABSTRACT

A liquid jet head includes an actuator substrate having a plurality of elongated grooves arrayed from an upper surface to a lower surface thereof. The grooves are formed from a vicinity of a peripheral end on one side of the actuator substrate to a peripheral end the other side thereof, ends of the grooves in a longitudinal direction thereof have respective inclined surfaces rising from the lower surface to the upper surface of the actuator substrate, and a crossing angle at crossing portions at which the inclined surfaces and the lower surface cross each other is in a range of 3 degrees to 80 degrees. A width W of the inclined surfaces in the longitudinal direction thereof and a thickness D of the actuator substrate satisfy a relationship $0.2 \leq (W/D) \leq 11$ at the ends on one side of the grooves.

9 Claims, 10 Drawing Sheets

Fig.13A
Fig.13B
Fig.13C
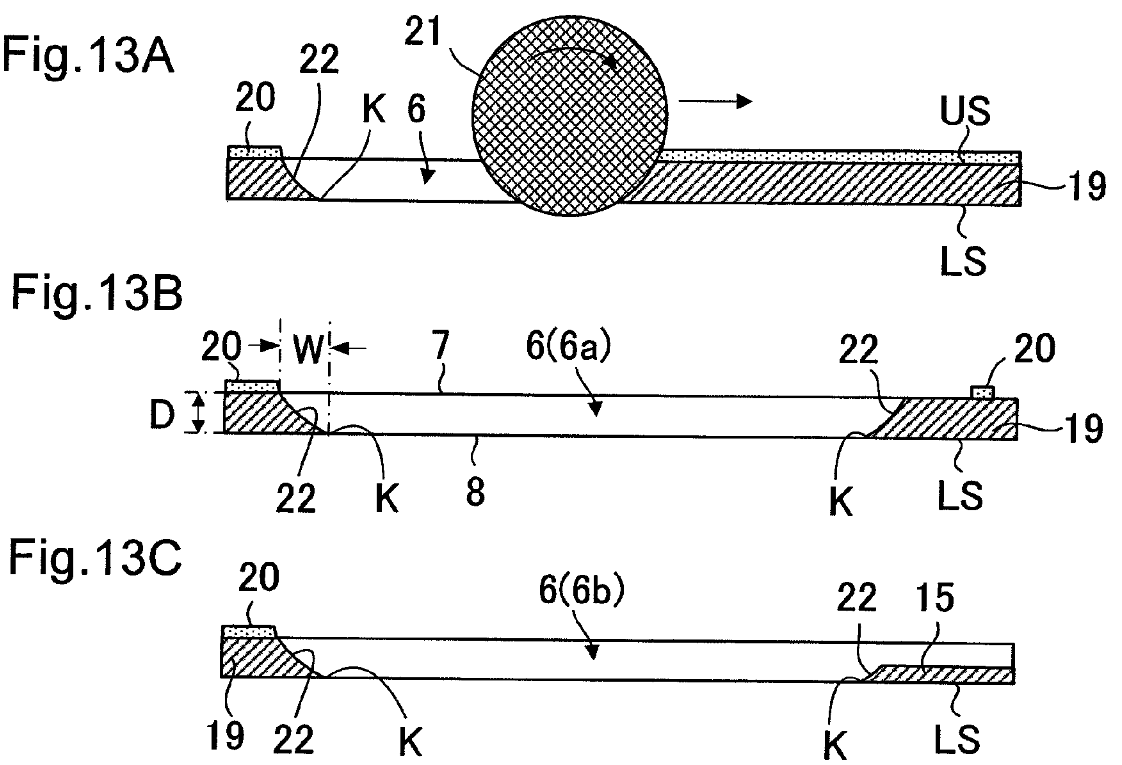
Fig.14
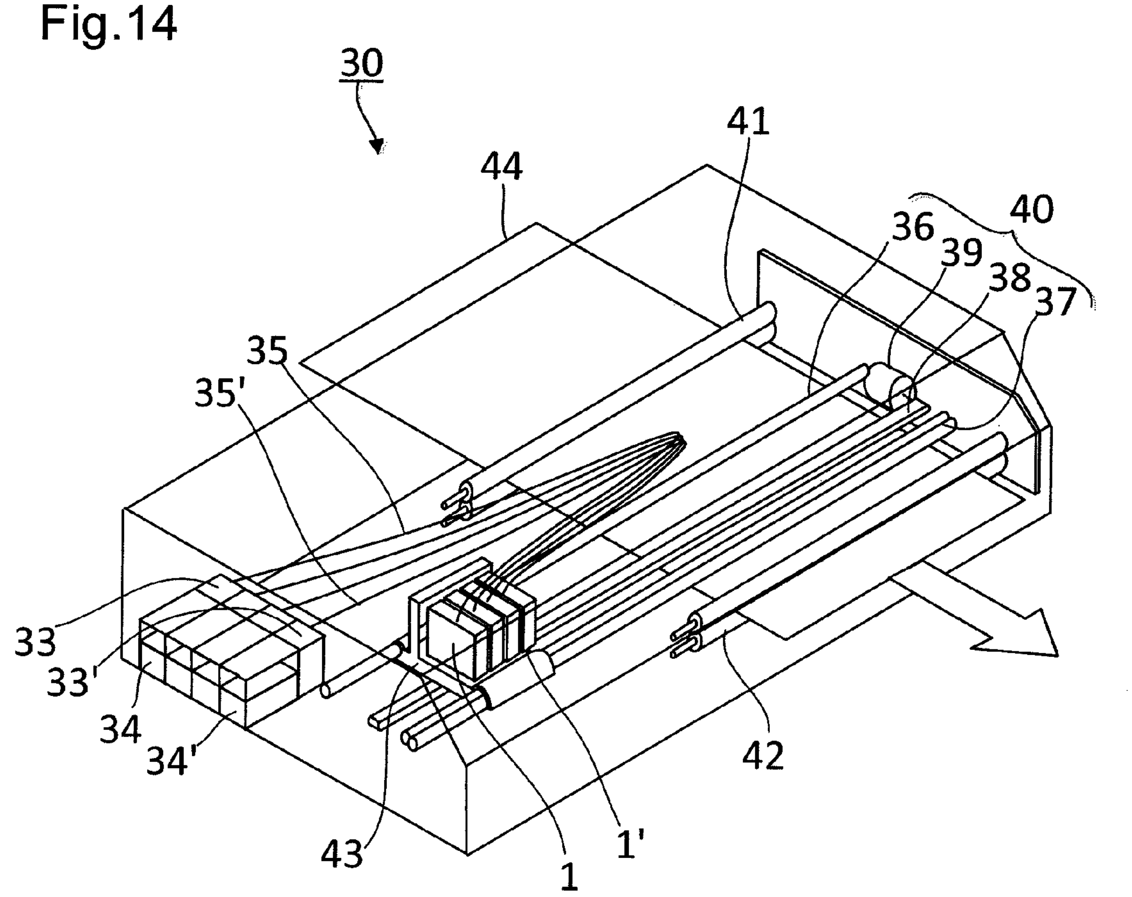

LIQUID JET HEAD, LIQUID JET APPARATUS, AND METHOD OF MANUFACTURING LIQUID JET HEAD

BACKGROUND

1. Technical Field

The present invention relates to a liquid jet head that ejects liquid droplets to perform recording on recording media, a liquid jet apparatus using the liquid jet head, and a method of manufacturing the liquid jet head.

2. Related Art

In recent years, ink jet type liquid jet heads have been used that eject ink droplets onto recording papers or the like to record characters and graphics or eject liquid materials onto the front surfaces of element substrates to form functional thin films. According to the liquid jet heads of this type, liquid such as ink and liquid materials is introduced into channels from liquid tanks via supply tubes, and pressure is applied to the liquid filled in the channels to eject the liquid from nozzles communicating with the channels. In ejecting the liquid, the liquid jet heads or recording media are moved to record characters and graphics or form functional thin films having prescribed shapes.

FIGS. 15A and 15B are cross-sectional schematic views of a liquid jet head 101 described in JP 2011-104791 A. FIG. 15A is a cross-sectional schematic view of a deep groove 105*a* for generating a pressure wave in liquid in the longitudinal direction thereof. FIG. 15B is a cross-sectional schematic view in a direction perpendicular to the longitudinal direction of grooves 105. The liquid jet head 101 has a laminate structure including a piezoelectric plate 104 of a piezoelectric body, a cover plate 108 which is adhered to one surface of the piezoelectric plate 104, a flow path member 111 which is adhered to an upper surface of the cover plate 108, and a nozzle plate 102 which is adhered to the other surface of the piezoelectric plate 104. Deep grooves 105*a* and shallow grooves 105*b* constituting the grooves 105 are alternately formed in parallel on the piezoelectric plate 104. Each of the deep grooves 105*a* penetrates the piezoelectric plate 104 from one surface to the other surface thereof. Each of the shallow grooves 105*b* is opened on the one surface of the piezoelectric plate 104, and the piezoelectric material is left on the other surface thereof. Side walls 106*a* to 106*c* are formed between the deep grooves 105*a* and the shallow grooves 105*b*. Drive electrodes 116*a* and 116*c* are formed on side surfaces of the respective deep grooves 105*a*. Drive electrodes 116*b* and 116*d* are formed on side surfaces of the respective shallow grooves 105*b*.

Liquid supply ports 109 and liquid discharge ports 110 are formed in the cover plate 108. Each of the liquid supply ports 109 communicates with one end of each of the deep grooves 105*a*, and each of the liquid discharge ports 110 communicates with the other end of each of the deep grooves 105*a*. A liquid supply chamber 112 and a liquid discharge chamber 113 are formed in the flow path member 111. The liquid supply chamber 112 communicates with the liquid supply ports 109, and the liquid discharge chamber 113 communicates with the liquid discharge ports 110. Nozzles 103 are formed in the nozzle plate 102, and communicate with the respective deep grooves 105*a*.

The liquid jet head 101 is driven in the following manner. Liquid supplied through a supply joint 114 which is disposed on the flow path member 111 passes through the liquid supply chamber 112 and the liquid supply port 109, and is then filled into the deep groove 105*a*. The liquid filled into the deep groove 105*a* further passes through the liquid discharge port 110 and the liquid discharge chamber 113, and is then discharged to the outside through a discharge joint 115. When a potential difference is applied between the drive electrodes 116*c* and 116*b*, and between the drive electrodes 116*c* and 116*d*, thickness-shear deformation of the side walls 106*b* and 106*c* is caused. As a result, a pressure wave is generated in the deep groove 105*a*, and liquid droplets are thereby ejected from the nozzle 103.

SUMMARY

In the liquid jet head 101 described in JP 2011-104791 A, the deep grooves 105*a* for liquid droplet ejection and the shallow grooves 105*b* not for liquid droplet ejection are alternately formed. The shallow grooves 105*b* are not opened toward the nozzle plate 102 of the piezoelectric plate 104. On the other hand, the deep grooves 105*a* are opened toward the nozzle plate 102 of the piezoelectric plate 104. The deep grooves 105*a* and the shallow grooves 105*b* are formed by using a dicing blade having a disk with abrasive grains of, for example, diamond embedded on the periphery thereof (also called a "diamond cutter"). Therefore, the outer shape of the dicing blade is transferred to both ends of each of the grooves 105. Generally, a dicing blade having a diameter of two inches or larger is used. For example, when the depth of the deep grooves 105*a* is 360 μm, and the depth of the shallow grooves 105*b* is 320 μm so as to leave the piezoelectric plate 104 of 40 μm on the bottom of each of the shallow grooves 105*b*, circular arc shapes of about 8 mm in total are formed on both ends of each of the shallow grooves 105*b* in the longitudinal direction thereof. The circular arc shapes on the both ends of the shallow groove 105*b* are unnecessary areas. If the length of such areas can be reduced, it is possible to form the liquid jet head 101 in a compact size, and also increase the number of piezoelectric plates 104 that can be taken from a single piezoelectric wafer.

In addition, in the liquid jet head 101 described in JP 2011-104791 A, the circular arc shapes formed on both ends of the deep grooves 105*a* serving as liquid droplet ejection grooves are extended to positions at which the circular arc shapes overlap the cover plate 108 between the liquid supply port 109 and the liquid discharge port 110. Therefore, an effective pumping length of the deep grooves 105*a* is reduced, which causes a reduction in ejection efficiency.

The present invention has been made in view of the above problems and provides a liquid jet head that is formed in a compact size as a whole by reducing a width of circular arc shapes at ends of grooves and can be manufactured with high yield, the circular arc shapes being formed by penetrating a piezoelectric plate from one surface to the other surface thereof.

A liquid jet head according to an embodiment of the present invention includes: an actuator substrate having a plurality of elongated grooves arrayed from an upper surface to a lower surface thereof, wherein the grooves are formed from a vicinity of a peripheral end on one side of the actuator substrate to the other side thereof, ends of the grooves in a longitudinal direction thereof have respective inclined surfaces rising from the lower surface to the upper surface of the actuator substrate, and a crossing angle at crossing portions at which the inclined surfaces and the lower surface cross each other is in a range of 3 degrees to 80 degrees.

In addition, a width W of the inclined surfaces in the longitudinal direction thereof and a thickness D of the actuator substrate satisfy a relationship $0.2 \leq (W/D) \leq 11$ at the ends on one side of the grooves.

Moreover, the grooves include respective alternately-arrayed ejection grooves and non-ejection grooves.

Furthermore, the ejection grooves are formed from the vicinity of the peripheral end on one side of the actuator substrate to a vicinity of a peripheral end on the other side thereof, the non-ejection grooves are extended from the vicinity of the peripheral end on one side of the actuator substrate to the peripheral end on the other side thereof and have respective raised bottom portions, each of which is a remainder of the actuator substrate, on bottoms thereof near the peripheral end on the other side, and ends of the raised bottom portions on one side thereof have the respective inclined surfaces rising from the lower surface of the actuator substrate to upper surfaces of the raised bottom portions, the inclined surfaces constituting the ends of the non-ejection grooves in the longitudinal direction thereof.

Furthermore, the liquid jet head further includes: a cover plate provided to partially cover upper surface openings of the ejection grooves and the non-ejection grooves and having first slits communicating with one side of the ejection grooves and second slits communicating with the other side thereof; and a nozzle plate provided to cover lower surface openings of the ejection grooves and the non-ejection grooves and having nozzles communicating with the ejection grooves.

Furthermore, opening portions opened to a side of the ejection grooves of the first and second slits are provided at positions at which the opening portions partially overlap the lower surface openings.

A liquid jet apparatus according to an embodiment of the present invention includes the liquid jet head described above; a moving mechanism configured to relatively move the liquid jet head and a recording medium; a liquid supply tube configured to supply liquid to the liquid jet head; and a liquid tank configured to supply the liquid to the liquid supply tube.

A method of manufacturing a liquid jet head according to an embodiment of the present invention includes: a groove formation step of forming a plurality of grooves in parallel in a piezoelectric substrate and forming inclined surfaces rising from bottom surfaces of the grooves to an upper surface of the piezoelectric substrate at ends of the grooves in a longitudinal direction thereof; a conductive body accumulation step of accumulating a conductive body on the piezoelectric substrate; an electrode formation step of patterning the conductive body to form electrodes; a cover plate provision step of providing a cover plate on the upper surface of the piezoelectric substrate; a piezoelectric substrate grinding step of grinding a lower surface on a side opposite to the upper surface of the piezoelectric substrate to set a crossing angle at crossing portions, at which the inclined surfaces and the lower surface cross each other, in a range of 3 degrees to 80 degrees; a nozzle plate provision step of providing a nozzle plate below the piezoelectric substrate.

In addition, the piezoelectric substrate grinding step includes grinding the lower surface of the piezoelectric substrate such that a width W of the inclined surfaces of the grooves in the longitudinal direction thereof and a thickness D of the piezoelectric substrate satisfy a relationship $0.2 \leq (W/D) \leq 11$ at ends on one side of the grooves.

A method of manufacturing a liquid jet head according to an embodiment of the present invention includes: a groove formation step of penetrating a piezoelectric substrate from an upper surface to a lower surface thereof to form inclined surfaces rising from the lower surface to the upper surface at ends of grooves in a longitudinal direction thereof and setting a crossing angle at crossing portions, at which the inclined surfaces and the lower surface cross each other, in a range of 3 degrees to 80 degrees; a conductive body accumulation step of accumulating a conductive body on the piezoelectric substrate; an electrode formation step of pattering the conductive body to form electrodes; and a cover plate provision step of providing a cover plate on the upper surface of the piezoelectric substrate; and a nozzle plate provision step of providing a nozzle plate below the piezoelectric substrate.

In addition, the groove formation step includes alternately forming ejection grooves and non-ejection grooves.

A liquid jet head according to the present invention includes: an actuator substrate having a plurality of elongated grooves arrayed from an upper surface to a lower surface thereof. The grooves are formed from a vicinity of a peripheral end on one side of the actuator substrate to the other side thereof, ends of the grooves in a longitudinal direction thereof have respective inclined surfaces rising from the lower surface to the upper surface of the actuator substrate, and a crossing angle at crossing portions at which the inclined surfaces and the lower surface cross each other is in a range of 3 degrees to 80 degrees. Accordingly, it is possible to provide a liquid jet head that can be formed in a compact size by reducing the length of the actuator substrate in the longitudinal direction of the ejection grooves, and can be manufactured with high yield by improving the processing strength in the rear surface of the actuator substrate.

BRIEF DESCRIPTION OF THE DRAWINGS

FIGS. 13A to 13C are views for explaining a groove formation step for the liquid jet head according to a fourth embodiment of the present invention;

FIG. 14 is a schematic perspective view of a liquid jet apparatus according to a fifth embodiment of the present invention.

DETAILED DESCRIPTION

First Embodiment

Figure 1A:
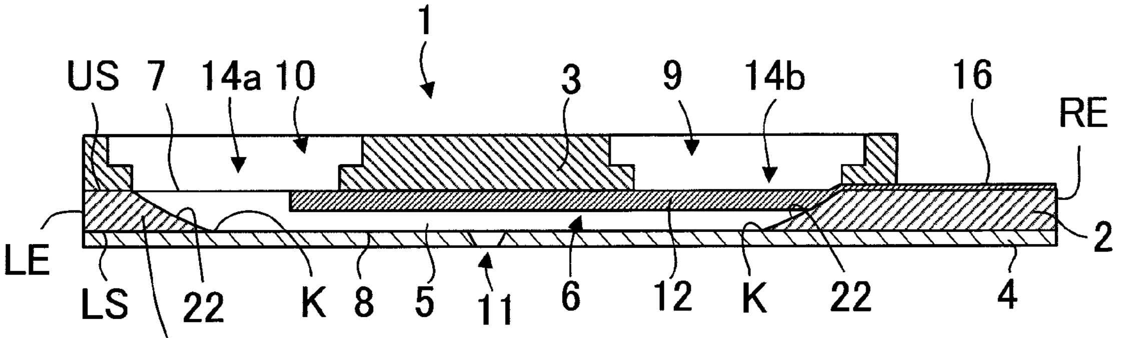
FIGS. 1A to 1D are schematic cross-sectional views of the liquid jet head according to a first embodiment of the present invention.
Figure 1B:
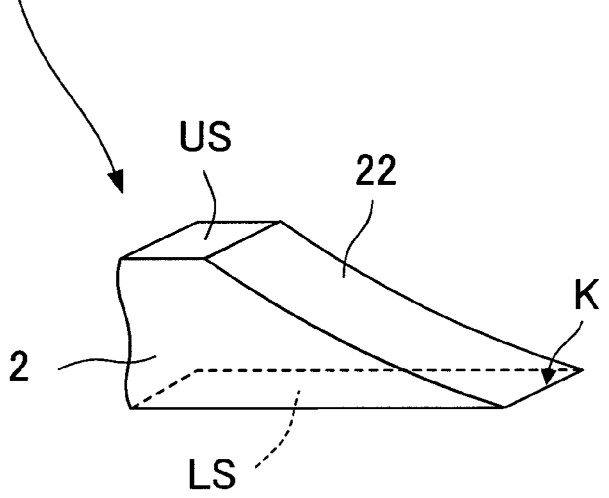
Figure 1C:
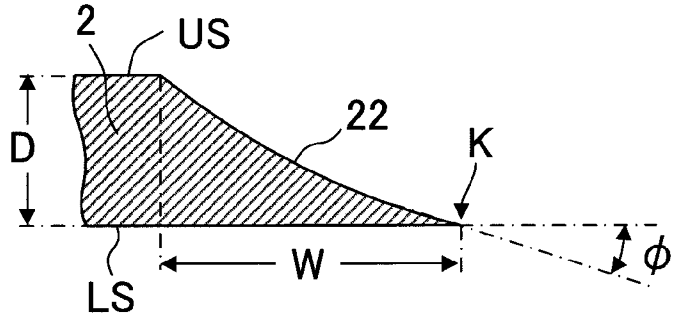
Figure 1D:
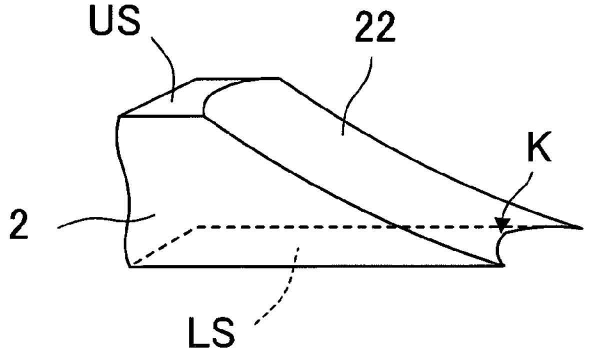

FIGS. 1A to 1D are explanatory diagrams of a liquid jet head 1 according to a first embodiment of the present invention. FIG. 1A is a schematic cross-sectional view of the liquid jet head 1. FIG. 1B is a schematic perspective view of an inclined surface 22. FIG. 1C is a schematic side view of the inclined surface 22 as seen from just beside the inclined surface 22. FIG. 1D is a schematic perspective view in a case in which the inclined surface 22 has a circular arc shape in the groove width direction thereof.

As illustrated in FIGS. 1A to 1D, the liquid jet head 1 is provided with an actuator substrate 2, a cover plate 3 attached to an upper surface US of the actuator substrate 2, and a nozzle plate 4 attached to a lower surface LS of the actuator substrate 2. The actuator substrate 2 has a plurality of elongated grooves 6 arrayed on the back side of space, the grooves penetrating from the upper surface US to the lower surface LS of the substrate. The grooves 6 are formed from positions in the vicinity of a peripheral end LE on one side of the actuator substrate 2 to a peripheral end RE on the other side thereof, and have the inclined surfaces 22 rising from the lower surface LS to the upper surface US of the actuator substrate 2 at ends in the longitudinal direction thereof. As illustrated in FIGS. 1B and 1C, a crossing angle $\phi$ at crossing portions K between the inclined surfaces 22 and the lower surface LS is in the range of 3 degrees to 80 degrees. Thus, it becomes possible to configure the liquid jet head 1 that can be formed in a compact size by reducing the length of the actuator substrate 2 in the direction of the grooves 6, and can be manufactured with high yield by improving processing strength in the lower surface LS of the actuator substrate 2.

Here, if the crossing angle $\phi$ is less than 3 degrees, the crossing portions K between the inclined surfaces 22 and the lower surface LS and portions near the crossing portions K become easily chipped, which reduces workability. In addition, a normal dicing blade has a limited cutting depth for grinding. In a case in which the crossing angle $\phi$ is increased to reduce a width W of the inclined surfaces 22 in the longitudinal direction thereof, the diameter of the dicing blade becomes small. Therefore, in consideration of workability such as grinding time, the crossing angle $\phi$ is set at 80 degrees or less. Moreover, if the crossing angle $\phi$ of the crossing portions K is greater than 80 degrees when the actuator substrate 2 is ground to open the grooves 6 in the lower surface LS after the formation of the grooves 6, the grinding amount of the actuator substrate 2 is increased, which reduces workability and increases the amount of a wasted material. In view of this, it is appropriate to set the crossing angle $\phi$ between the inclined surfaces 22 and the lower surface LS in the range of 3 degrees to 80 degrees. It is preferable to set the crossing angle $\phi$ in the range of 3 degrees to 22 degrees to prevent the crossing portions K from becoming chipped and reduce the grinding amount of a piezoelectric substrate 19 to shorten grinding time.

Note that although the tip ends may become chipped if the crossing angle $\phi$ is acute, the crossing angle $\phi$ represents the angle between the inclined surfaces 22 and the lower surface LS near the crossing portions K rather than the angle between the cross sections of chipped portions and the inclined surfaces 22 or the angle between the cross sections of chipped portions and the lower surface LS (same applies to the embodiments below).

In addition, as illustrated in FIG. 1C, the width W of the inclined surfaces 22 in the longitudinal direction thereof at the ends on one side of the grooves 6 and a thickness D of the actuator substrate 2 are formed to satisfy the relationship $0.2 \leq (W/D) \leq 11$. If (W/D) is less than 0.2, the diameter of the dicing blade becomes small, which reduces workability such as grinding time. Moreover, the grinding amount of the lower surface LS of the actuator substrate 2 is increased, which lengthens grinding time and increases the amount of a wasted material. Moreover, if (W/D) is greater than 11, the formation of the liquid jet head 1 in a compact size becomes difficult and the crossing portions K between the inclined surfaces 22 and the lower surface LS and portions near the crossing portions K become easily chipped with an increase in the length of the actuator substrate 2 in the direction of the grooves 6, which reduces workability and hinders quality management. Preferably, it is possible to improve workability and form the liquid jet head 1 in a compact size with $1 \leq (W/D) \leq 11$.

Note that as illustrated in FIG. 1D, the inclined surfaces 22 are actually not flat in the groove width direction but are deeply ground in recessed form at the central areas thereof. This is because the peripheral grinding surface of the dicing blade has a circular arc shape in the board thickness direction thereof when forming the grooves 6. Therefore, the crossing portions K between the inclined surfaces 22 and the lower surface LS have a circular arc or elliptical curve. In this case, the crossing angle $\phi$ is an average crossing angle in the longitudinal direction of the grooves 6 at the crossing portions K at which the inclined surfaces 22 and the lower surface LS cross each other. In addition, if the crossing portions K become chipped, the crossing angle $\phi$ represents, as in the above, the average angle between the inclined surfaces 22 and the lower surface LS near the crossing portions K rather than the angle between the cross sections of chipped portions and the inclined surfaces 22 or the angle between the cross sections of chipped portions and the lower surface LS (same applies to the embodiments below).

A more detailed description will be given below. The actuator substrate 2 has upper surface openings 7 through which the grooves 6 are opened on the upper surface US and lower surface openings 8 through which the grooves 6 are opened on the lower surface LS. Walls 5 are formed between the adjacent grooves 6 of the actuator substrate 2, and drive electrodes 12 for driving the walls 5 are formed at the upper-half portions of the side surfaces of the walls 5. Terminals 16 connected to external circuits are formed on the upper surface US near the peripheral end RE on the other side of the actuator substrate 2 and electrically connected to the drive electrodes 12.

A cover plate 3 is provided on the upper surface US of the actuator substrate 2 to cover the upper surface openings 7 and expose the terminals 16. The cover plate 3 includes a liquid discharge chamber 10 and first slits 14*a* communicating with the liquid discharge chamber 10 on one side thereof, and includes a liquid supply chamber 9 and second slits 14*b* communicating with the liquid supply chamber 9 on the other side thereof. The first slits 14*a* communicate with one side of the grooves 6, and the second slits 14*b* communicate with the other side thereof. Here, the opening portions, all of which are opened to the side of the grooves 6, of the first slits 14*a* and the second slits 14*b* are provided at positions at which the opening portions partially overlap the lower surface openings 8 of the grooves 6. In addition, the drive electrodes 12 are formed from positions, which are in the vicinity of the ends on one side of the grooves 6 and to which the first slits 14*a* are opened, to the ends on the other side of the grooves 6. The nozzle plate 4 is provided on the lower surface LS of the actuator substrate 2 to cover the lower surface openings 8. The nozzle plate 4 has nozzles 11 communicating with the grooves 6.

The actuator substrate 2 may be made of a piezoelectric material, e.g., PZT ceramics, to which polarization treatment is applied in a direction perpendicular to the upper surface US. The thickness of the actuator substrate 2 is, for example, in the range of 300 μm to 400 μm, and preferably 360 μm. The cover plate 3 may be made of the same PZT ceramics as the actuator substrate 2, machinable ceramics, some other ceramics, or a low dielectric material such as glass. If the cover plate 3 is made of the same material as the actuator substrate 2, the cover plate 3 and the actuator substrate 2 become equal in the coefficient of thermal expansion, which may prevent the occurrence of warpage and deformation upon temperature change.

The nozzle plate 4 may be made of a polyimide film, a polypropylene film, some other synthetic resin film, a metal film, or the like. Here, the cover plate 3 preferably has a thickness of 0.3 mm to 1.0 mm, and the nozzle plate 4 preferably has a thickness of 0.01 mm to 0.1 mm. If the thickness of the cover plate 3 is less than 0.3 mm, the strength of the cover plate 3 reduces. On the other hand, if the thickness of the cover plate 3 is greater than 1.0 mm, time for processing the liquid supply chamber 9, the liquid discharge chamber 10, the first slits 14*a*, and the second slits 14*b* becomes long and the cost for manufacturing the cover plate 3 becomes high due to an increase in material. If the thickness of the nozzle plate 4 is less than 0.01 mm, the strength of the nozzle plate 4 reduces. On the other hand, if the thickness of the nozzle plate 4 is greater than 0.1 mm, vibrations are transmitted to the adjacent nozzles 11, which increase the likelihood of the occurrence of crosstalk.

Note that the PZT ceramics has a Young's modulus of 58.48 GPa and the polyimide film has a Young's modulus of 3.4 GPa. Accordingly, if the cover plate 3 is made of the PZT ceramics and the nozzle plate 4 is made of the polyimide film, the cover plate 3 covering the upper surface US of the actuator substrate 2 becomes higher in stiffness than the nozzle plate 4 covering the lower surface LS. The Young's modulus of the material of the cover plate 3 is preferably not less than 40 GPa, and that of the material of the nozzle plate 4 preferably falls within the range of 1.5 GPa to 30 GPa. If the Young's modulus of the material of the nozzle plate 4 is less than 1.5 GPa, the nozzle plate 4 is easily scratched when coming in contact with a recording medium, which reduces reliability. On the other hand, if the Young's modulus of the material of the nozzle plate 4 is greater than 30 GPa, vibrations are transmitted to the adjacent nozzles 11, which increase the likelihood of the occurrence of crosstalk.

The liquid jet head 1 operates as follows. Liquid is supplied to the liquid supply chamber 9 and discharged from the liquid discharge chamber 10 to be circulated. Then, a drive signal is transmitted to the terminals 16 to cause thickness-shear deformation in both of the walls 5 constituting the grooves 6. At this time, both of the walls 5 are deformed in a "truncated chevron shape" or in a "dogleg shape". Thus, a pressure wave is generated in the liquid inside grooves 6, whereby liquid droplets are ejected from the nozzles 11 communicating with the grooves 6. Here, the pumping length of the grooves 6 in which the pressure is effectively applied to the liquid corresponds to the region between the liquid discharge chamber 10 and the liquid supply chamber 9. In the present embodiment, since the opening portions, all of which are opened to the grooves 6, of the first and second slits 14*a* and 14*b* are provided at the positions at which the opening portions partially overlap the lower surface openings 8, it is possible to ensure a basic length of the grooves to effectively generate the pressure wave.

Note that although the drive electrodes 12 are formed on the upper-half portions of the side surfaces of the grooves 6, the present invention is not limited to this. That is, the drive electrodes 12 may be formed up to a depth at which the drive electrodes 12 do not reach the nozzle plate 4. In addition, the nozzle plate 4 may have a multi-layer structure made of, for example, a sub-plate and a synthetic resin material. Moreover, the present embodiment describes the liquid jet head 1 having the plurality of grooves 6 for ejecting liquid arrayed in parallel. However, instead of this, the liquid jet head 1 may have the grooves 6 including alternately-arrayed ejection grooves and non-ejection grooves and independently drive each of the ejection grooves. Furthermore, the present embodiment describes the liquid jet head 1 of the liquid circulation type in which liquid flows in the liquid supply chamber 9 and is discharged from the liquid discharge chamber 10. However, the liquid jet head 1 of a liquid circulation type may be employed in which liquid flows in the liquid discharge chamber 10 and is discharged from the liquid supply chamber 9. Furthermore, the liquid jet head 1 of a non-circulation type may be employed in which liquid is supplied from the liquid supply chamber 9 while blocking the liquid discharge chamber 10 and the first slits 14*a* or the liquid is supplied from the liquid discharge chamber 10 while blocking the liquid supply chamber 9 and the second slits 14*b*.

Second Embodiment

Figure 2:
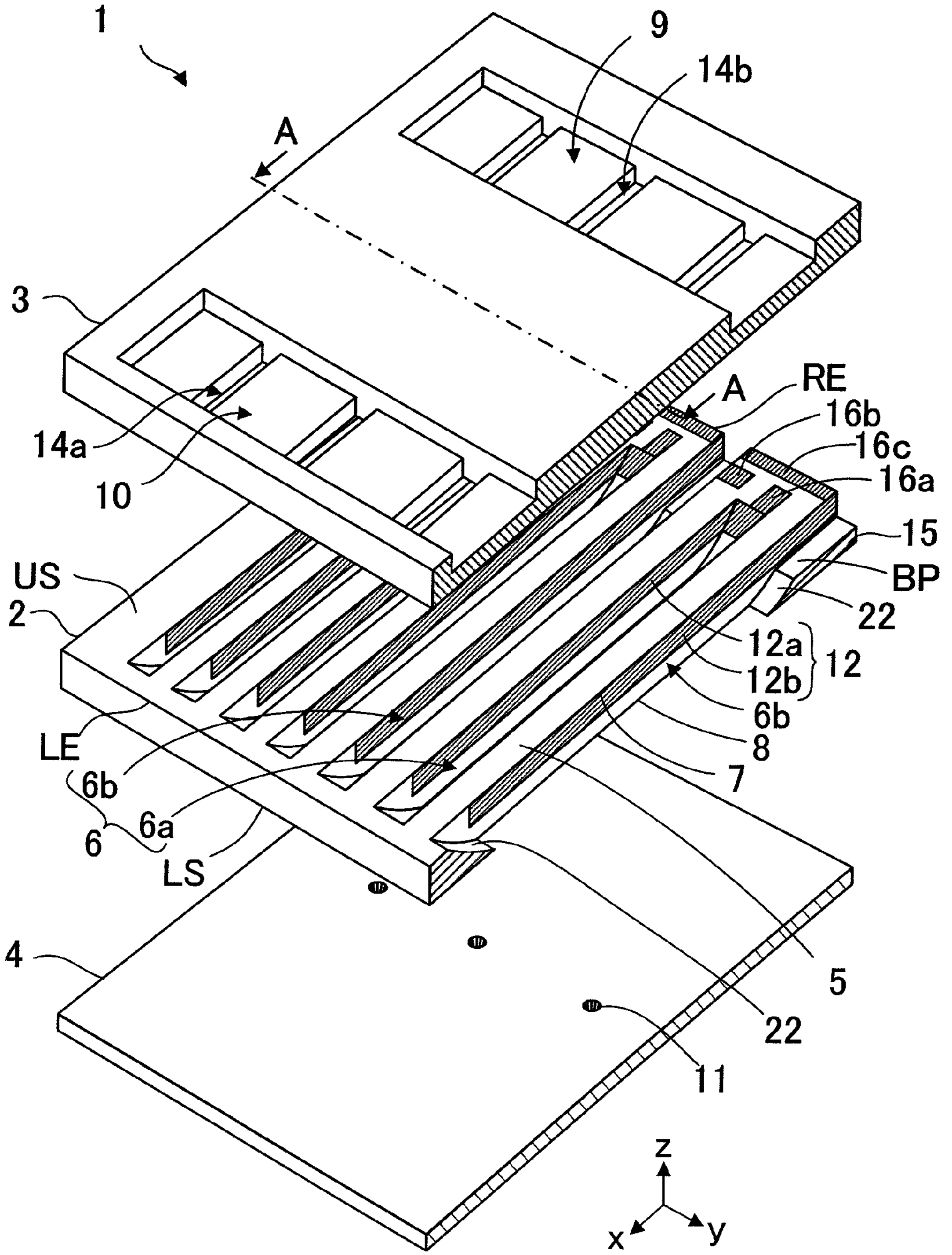
FIG. 2 is an exploded perspective view of the liquid jet head according to a second embodiment of the present invention.
Figure 3A:
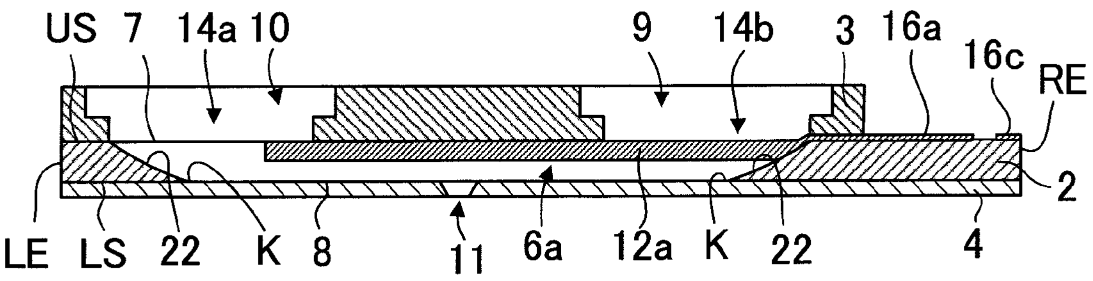
FIGS. 3A to 3C are schematic cross-sectional views of the liquid jet head according to the second embodiment of the present invention.
Figure 3B:
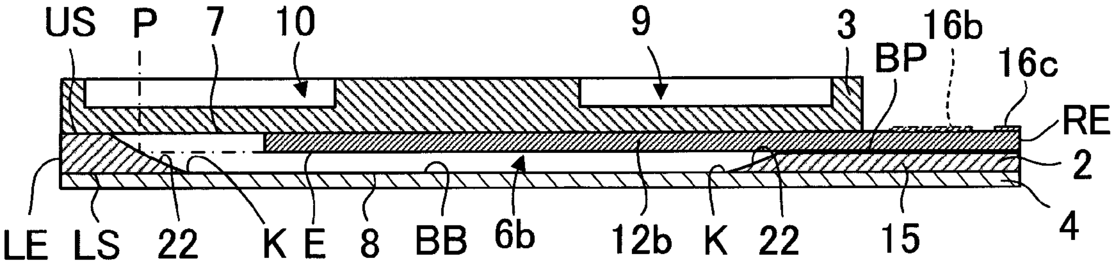
Figure 3C:
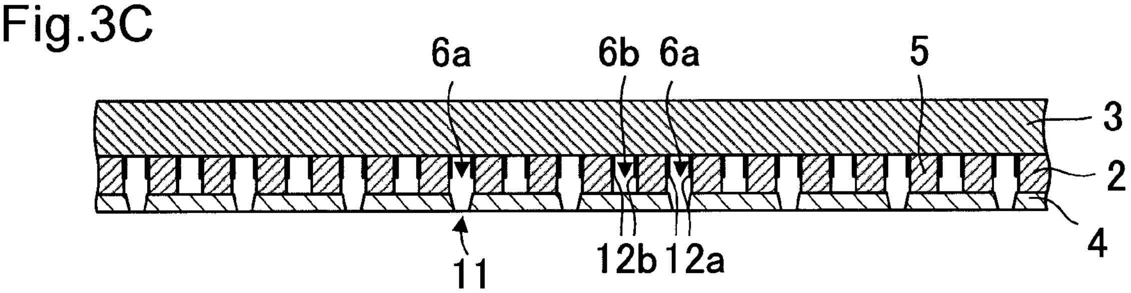

FIG. 2 and FIGS. 3A to 3C are views for explaining the liquid jet head 1 according to a second embodiment of the present invention. FIG. 2 is an exploded perspective view of the liquid jet head 1. FIGS. 3A to 3C are schematic cross-sectional views of the liquid jet head 1. FIG. 3A is a schematic cross-sectional view along the longitudinal direction of an ejection groove 6*a*. FIG. 3B is a schematic cross-sectional view along the longitudinal direction of a non-ejection groove 6*b*. FIG. 3C is a partial schematic cross-sectional view along the line A-A in FIG. 2. The same portions or portions having the same functions will be denoted by the same symbols.

As illustrated in FIG. 2 and FIGS. 3A to 3C, the liquid jet head 1 includes an actuator substrate 2, a cover plate 3 provided on the actuator substrate 2, and a nozzle plate 4 provided beneath the actuator substrate 2. Elongated ejection grooves 6*a* and elongated non-ejection grooves 6*b*, each of which penetrates the actuator substrate 2 from an upper surface US to a lower surface LS thereof, are alternately arrayed and partitioned by elongated walls 5 of a piezoelectric body in the actuator substrate 2. The cover plate 3 is provided on an upper surface US of the actuator substrate 2 to cover upper surface openings 7 of the ejection grooves 6*a* and the non-ejection grooves 6*b*. The cover plate 3 has first slits 14*a* communicating with one side of the ejection grooves 6*a* and second slits 14*b* communicating with the other side thereof. The nozzle plate 4 is provided with nozzles 11 which communicate with the respective ejection grooves 6*a*, and provided on the lower surface LS of the actuator substrate 2 so as to cover lower surface openings 8 of the ejection grooves 6*a* and the non-ejection grooves 6*b*.

Common electrodes 12*a* are formed in strip form on side surfaces, the side surfaces facing the ejection grooves 6*a*, of the walls 5 along the longitudinal direction thereof. Active electrodes 12*b* are formed in strip form on side surfaces, the side surfaces facing the non-ejection grooves 6*b*, of the walls 5 along the longitudinal direction thereof. In each of the non-ejection grooves 6*b*, an end positioned at the other side extends up to a peripheral end RE of the actuator substrate 2 positioned at the other side (hereinbelow, referred to as a peripheral end RE on the other side). Near the peripheral end RE on the other side of the actuator substrate 2, raised bottom portions 15, each of which is the remainder of the actuator substrate 2, are formed on the bottoms of the non-ejection grooves 6*b* on the second end thereof. The active electrodes 12*b* are provided above upper surfaces BP of the raised bottom portions 15.

Here, the ejection grooves 6*a* and the non-ejection grooves 6*b* have, at the ends in the longitudinal direction thereof, the inclined surfaces 22 rising from the lower surface LS to the upper surface US of the actuator substrate 2, and the crossing angle at the crossing portions K at which the inclined surfaces 22 and the lower surface LS cross each other is the range of 3 degrees to 80 degrees. Note that the ends on one side of the raised bottom portions 15 have the respective inclined surfaces 22 rising from the lower surface LS of the actuator substrate 2 to the upper surfaces BP of the raised bottom portions 15, and these inclined surfaces 22 constitute the ends on the other side of the non-ejection grooves 6*b* in the longitudinal direction thereof.

If the crossing angle at the crossing portions is less than 3 degrees, the crossing portions K between the inclined surfaces 22 and the lower surface LS and portions near the crossing portions K become easily chipped, which reduces workability. In addition, a dicing blade normally has a limited cutting depth for grinding. In a case in which the crossing angle is increased to reduce the width W of the inclined surfaces 22 in the longitudinal direction, the diameter of the dicing blade becomes small. Therefore, in consideration of workability such as grinding time, the crossing angle is set at 80 degrees or less. Moreover, if the crossing angle at the crossing portions K is greater than 80 degrees when the actuator substrate 2 is ground to open the grooves 6 in the lower surface LS after the formation of the grooves 6, the grinding and removing amount of the actuator substrate 2 is increased, which reduces workability and increases the amount of a wasted material. In view of this, it is appropriate to set the crossing angle $\phi$ between the inclined surfaces 22 and the lower surface LS in the range of 3 degrees to 80 degrees. It is preferable to set the crossing angle in the range of 3 degrees to 22 degrees to prevent the crossing portions K from becoming chipped and reduce the grinding amount of the piezoelectric substrate 19 to shorten grinding time.

In addition, the width W of the inclined surfaces 22 in the longitudinal direction thereof at both ends of the ejection grooves 6*a* and at the ends on one side of the non-ejection grooves 6*b* and the thickness D (see FIG. 1C) of the actuator substrate 2 are formed to satisfy the relationship $0.2 \leq (W/D) \leq 11$. If (W/D) is less than 0.2, the diameter of the dicing blade becomes small, which reduces workability such as grinding time. Moreover, the grinding amount of the lower surface LS of the actuator substrate 1 is increased, which lengthens grinding time and increases the amount of a wasted material. Furthermore, if (W/D) is greater than 11, the formation of the liquid jet head 1 in a compact size becomes difficult and the crossing portions K between the inclined surfaces 22 and the lower surface LS and portions near the crossing portions K become easily chipped with an increase in the length of the ejection grooves 6 and the non-ejection grooves 6*b*, which reduces workability and hinders quality management.

Here, a description will be given in further detail of the liquid jet head 1. Grooves 6 formed in the actuator substrate 2 include the ejection grooves 6*a* and the non-ejection grooves 6*b*. The ejection grooves 6*a* and the non-ejection grooves 6*b* are alternately arrayed in parallel in a direction (y direction) orthogonal to the longitudinal direction (x direction) of the grooves 6. The ejection grooves 6*a* have, at both side ends thereof in the longitudinal direction, inclined surfaces 22 rising from lower surface openings 8 to the upper surface openings 7 of the actuator substrate 2, i.e., from the lower surface LS to the upper surface US. The ejection grooves 6*a* are formed from positions in the vicinity of a peripheral end LE on one side of the actuator substrate 2 to positions in the vicinity of a peripheral end RE on the other side thereof, i.e., to the positions in the vicinity of the end of the cover plate 3. Ends on one side of the non-ejection grooves 6*b* have an inclined surface 22 rising from the lower surface opening 8 (bottom surface BB) toward the upper surface opening 7 thereof. Ends on the other side of each of the non-ejection grooves 6*b* extend up to the peripheral end RE on the other side of the actuator substrate 2. Near the peripheral end RE on the other side of the actuator substrate 2, the raised bottom portions 15, each of which is the remainder of the actuator substrate 2, are formed on the bottoms of the non-ejection grooves 6*b* on the second end thereof. Like the ends on the other side of the ejection grooves 6*a*, the ends on one side of the raised bottom portions 15 have the inclined surfaces 22 rising from the lower surface LS to the upper surfaces BP of the raised bottom portions 15. The raised bottom portions 15 can be formed so that the upper surfaces BP thereof are positioned below approximately half the depth of the ejection grooves 6*a*.

In the present invention, when forming the respective grooves 6, it is possible to grind the actuator substrate 2 up to a depth deeper than the final depth of the grooves 6 using a dicing blade. Therefore, it is possible to reduce the length of each of the inclined surfaces 22 in the longitudinal direction thereof to form the actuator substrate 2 in a compact size. Further, by forming the raised bottom portions 15, it is possible to improve the strength in an end part on the other side of the actuator substrate 2. More specifically, the lower surface openings 8 of the actuator substrate 2 are formed by deeply forming grooves in the actuator substrate 2 so as to penetrate the actuator substrate 2 from the upper surface US to the lower surface LS thereof. Alternatively, the lower surface openings 8 are opened by deeply forming grooves in the actuator substrate 2, and then grinding the lower surface LS of the actuator substrate. If the non-ejection grooves 6*b* do not have the raised bottom portions 15 formed thereon, and are formed flat up to the peripheral end RE on the other side, the actuator substrate 2 has a comb shape in which a plurality of comb teeth, composed of the walls 5 which sandwich the respective ejection grooves 6*a* therebetween, is aligned in an arraying direction of the grooves 6. When the comb-shaped actuator substrate 2 is ground from the lower surface LS, problems such as breaking and chipping of tips of the comb tooth occur. Therefore, it becomes difficult to manufacture the liquid jet head 1. On the other hand, when the raised bottom portions 15 are formed on the second ends of the respective non-ejection grooves 6*b*, the material of the actuator substrate 2 is continuously left on the lower surface LS near the peripheral end RE on the other side. Therefore, the strength against the breaking or chipping at the time of grinding is improved.

The drive electrodes 12 include common electrodes 12*a* formed on the side surfaces of the ejection grooves 6*a* and active electrodes 12*b* formed on the side surfaces of the non-ejection grooves 6_b_. The common electrodes 12_a_ are provided in a strip form along the longitudinal direction of both side surfaces of the walls 5 facing the ejection grooves 6_a_ and are electrically connected to each other. The common electrodes 12_a_ are provided from the positions of the ejection grooves 6_a_, to which the first slits 14_a_ open, to the ends on the other side of the ejection grooves 6_a_. The active electrodes 12_b_ are formed on side surfaces, the side surfaces facing the non-ejection grooves 6_b_, of the walls 5. Each of the active electrodes 12_b_ is arranged from a position in the vicinity of the end on one side of each of the non-ejection grooves 6_b_ up to the peripheral end RE on the other side of the actuator substrate 2. As illustrated in FIG. 3B, an end on one side of each of the active electrodes 12_b_ positioned is located closer to the other side from a point P on the inclined surface 22 at the same depth as a lower end E of the active electrode 12_b_. For example, when the lower end E of each of the active electrodes 12_b_ is positioned at approximately half the depth of the bottom surface BB of the non-ejection groove 6_b_, the end on one side of the active electrode 12_b_ is positioned closer to the other side from the point P on the inclined surface 22 at approximately half the depth between the upper surface US of the actuator substrate 2 and the bottom surface BB.

The common electrodes 12_a_ and the active electrodes 12_b_ are separated from the nozzle plate 4 constituting the bottom surfaces BB of the ejection grooves 6_a_ and the non-ejection grooves 6_b_. Specifically, the lower ends E of the common electrodes 12_a_ and the active electrodes 12_b_ are positioned so as not to reach the upper surfaces BP of the raised bottom portions 15. On the upper surface US of the actuator substrate 2, there are arranged, near the peripheral end RE on the other side, common terminals 16_a_ which are electrically connected to the respective common electrodes 12_a_, active terminals 16_b_ which are electrically connected to the respective active electrodes 12_b_, and wirings 16_c_ each of which electrically connects the active terminal 16_b_ and the active electrode 12_b_ that is formed on an adjacent non-ejection grooves 6_b_. The common terminals 16_a_ and the active terminals 16_b_ are lands connected to a wiring electrode on a flexible substrate (not shown). Each of the active terminals 16_b_ is electrically connected to an active electrode 12_b_ that is formed on the side surface of one of two walls 5 that sandwich an ejection groove 6_a_ therebetween, the side surface facing a non-ejection groove 6_b_. Further, the active terminal 16_b_ is electrically connected to an active electrode 12_b_ that is formed on the side surface of the other one of the two walls 5, the surface facing a non-ejection groove 6_b_, via a wiring 16_c_ formed along the peripheral end RE on the other side.

In this manner, since the ejection grooves 6_a_ are formed from the positions at which the first slits 14_a_ are opened, it is possible to efficiently generate a pressure wave in liquid inside the ejection grooves 6_a_. Further, the active electrodes 12_b_ formed on the both side surfaces of each of the non-ejection grooves 6_b_ are arranged in the vicinity of the end on one side of the non-ejection groove 6_b_ up to the peripheral end RE on the other side of the actuator substrate 2. More specifically, the end on one side of each of the active electrodes 12_b_ is arranged closer to the other side from the point on the inclined surface 22 at the same depth as the lower end E of the active electrode 12_b_ in the longitudinal direction of the non-ejection groove 6_b_. In addition, the upper surfaces BP of the raised bottom portions 15 are positioned below the lower ends E of the active electrodes 12_b_, and no electrode material is accumulated on the upper surfaces BP. Therefore, on the end on one side of each of the non-ejection grooves 6_b_, two active electrodes 12_b_ that face each other inside the non-ejection groove 6_b_ are prevented from being electrically connected to each other via the inclined surface 22. Similarly, at the ends on the other side, the respective two active electrodes 12_b_ facing each other inside the non-ejection grooves 6_b_ are prevented from being electrically conductive via the upper surfaces BP. Thus, the active electrodes 12_b_ formed on both side surfaces of the non-ejection grooves 6_b_ are electrically separated from each other. Since the above electrode structure may be formed in a lump according to an oblique deposition method that will be described later, manufacturing process steps therefor become very simple.

The cover plate 3 has a liquid discharge chamber 10 on one side of the actuator substrate 2 and a liquid supply chamber 9 on the other side thereof. The cover plate 3 is adhered to the upper surface US of the actuator substrate 2 with an adhesive such that the ejection grooves 6_a_ are partially covered and the common terminals 16_a_ and the active terminals 16_b_ are exposed. The liquid supply chamber 9 communicates with the ends on the other side of the ejection grooves 6_a_ via the second slits 14_b_ and does not communicate with the non-ejection grooves 6_b_. The liquid discharge chamber 10 communicates with the ends on one side of the ejection grooves 6_a_ via the first slits 14_a_ and does not communicate with the non-ejection grooves 6_b_. That is, the upper surface openings 7 of the non-ejection grooves 6_b_ are covered with the cover plate 3. The nozzle plate 4 is adhered to the lower surface LS of the actuator substrate 2 with an adhesive. The nozzles 11 are formed at substantially central positions in the longitudinal direction of the ejection grooves 6_a_. Liquid supplied to the liquid supply chamber 9 flows into the ejection grooves 6_a_ via the second slits 14_b_ and is discharged to the liquid discharge chamber 10 via the first slits 14_a_. Conversely, since the non-ejection grooves 6_b_ do not communicate with the liquid supply chamber 9 or the liquid discharge chamber 10, the liquid does not flow into the non-ejection grooves 6_b_. Here, the nozzle plate 4 is lower in stiffness than the cover plate 3.

The liquid jet head 1 operates as follows. Liquid is supplied to the liquid supply chamber 9 and discharged from the liquid discharge chamber 10 to be circulated. Then, a drive signal is transmitted to the common terminals 16_a_ and the active terminals 16_b_ to cause thickness-shear deformation in both of the walls 5 constituting the ejection grooves 6_a_. At this time, both of the walls 5 are deformed in a "truncated chevron shape" or in a "dogleg shape". Thus, a pressure wave is generated in the liquid inside the ejection grooves 6_a_, whereby liquid droplets are ejected from the nozzles 11 communicating with the ejection grooves 6_a_. According to the present embodiment, since the active electrodes 12_b_ provided on the side surfaces of both of the walls 5 of the non-ejection grooves 6_b_ are electrically separated from each other, the respective ejection grooves 6_a_ may be independently driven. The advantage of the independent drive of the respective ejection grooves 6_a_ is to allow high frequency drive. In addition, it is also possible to form protection films on inner walls with which liquid comes in contact.

Note that the materials, configurations, and physical properties of the actuator substrate 2, the cover plate 3, and the nozzle plate 4 are the same as those described in the first embodiment. Note that the whole actuator substrate 2 is not necessarily made of a piezoelectric body. That is, the walls 5 may be made of piezoelectric bodies, and portions other than the walls 5 may be made of insulation bodies composed of non-piezoelectric bodies. In addition, the present embodiment describes the case in which the raised bottom portions 15 are formed at the ends on the other side of the non-ejection grooves 6_b_ and the active electrodes 12_b_ are provided on the side surfaces above the upper surface BP of the raised bottom portions 15 and extended to the peripheral end RE on the other side of the actuator substrate 2. However, the present invention is not limited to this configuration. Wiring electrodes may be formed on the upper surface US along the non-ejection grooves 6*b*, and the active electrodes 12*b* and the active terminals 16*b* may be electrically connected to each other via the wiring electrodes. Moreover, the liquid discharge chamber 10 and the liquid supply chamber 9 may operate in a reverse way. That is, liquid may be supplied from the liquid discharge chamber 10 and discharged from the liquid supply chamber 9.

Third Embodiment

Figure 4:
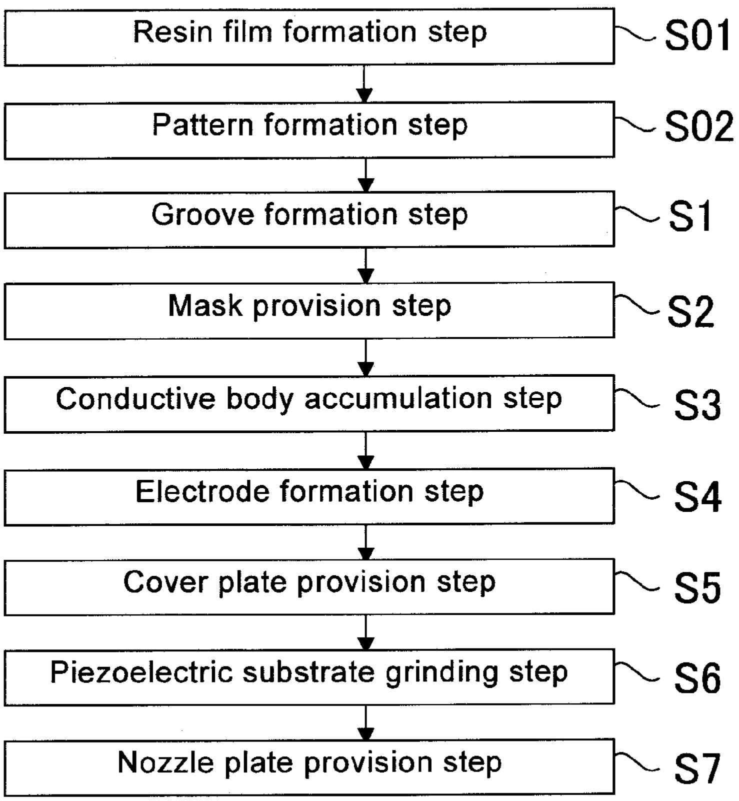
FIG. 4 is a flowchart of the manufacturing process steps of the method of manufacturing the liquid jet head according to a third embodiment of the present invention.

FIG. 4 to FIGS. 12A and 12B explain a method of manufacturing the liquid jet head 1 according to a third embodiment of the present invention. FIG. 4 is a flowchart for explaining the manufacturing process steps of the liquid jet head 1 according to the third embodiment of the present invention. FIGS. 5A and 5B to FIGS. 12A and 12B are views for explaining the respective manufacturing process steps. Hereinafter, with reference to FIG. 4 and FIGS. 5A and 5B to FIGS. 12A and 12B, a description will be given in detail of the method of manufacturing the liquid jet head 1. In addition, the same portions or portions having the same functions as those of the first embodiment will be denoted by the same symbols.

Figure 5A:
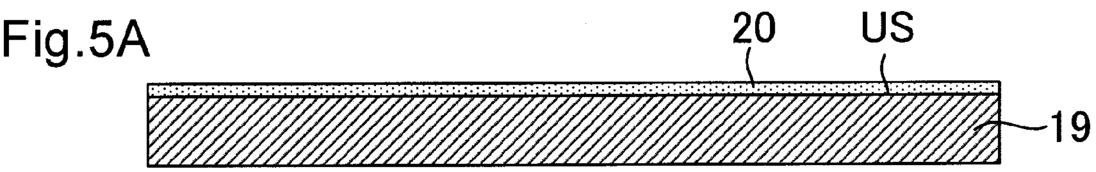
FIGS. 5A and 5B are schematic cross-sectional views of the piezoelectric substrate of the liquid jet head according to the third embodiment of the present invention.
Figure 5B:
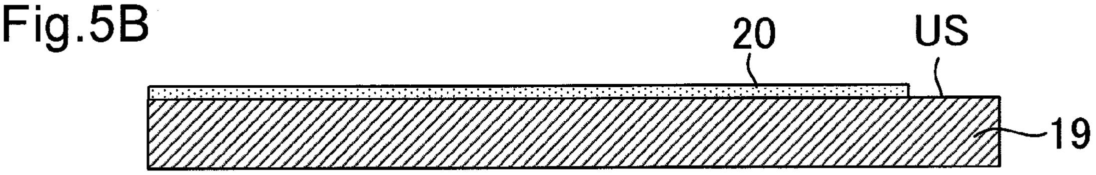

FIGS. 5A and 5B are schematic cross-sectional views of the piezoelectric substrate 19. As illustrated in FIG. 5A, a photosensitive resin film 20 is provided on the upper surface US of the piezoelectric substrate 19 in a resin film formation step S01. The piezoelectric substrate 19 may be made of PZT ceramics. As the resin film 20, a resist film may be coated. Alternatively, a photosensitive resin film may be provided. Then, as illustrated in FIG. 5B, the resin film 20 is patterned by exposure and development in a pattern formation step S02. The resin film 20 in regions in which electrodes are to be formed is removed, while the resin film 20 in regions in which the electrodes are not to be formed is caused to remain. This is because the electrodes are to be patterned according to a lift-off method later. Note that the resin film formation step S01 and the pattern formation step S02 are the steps of forming electrode patterns according to the lift-off method but are not essential requirements for the present invention.

Figure 6A:
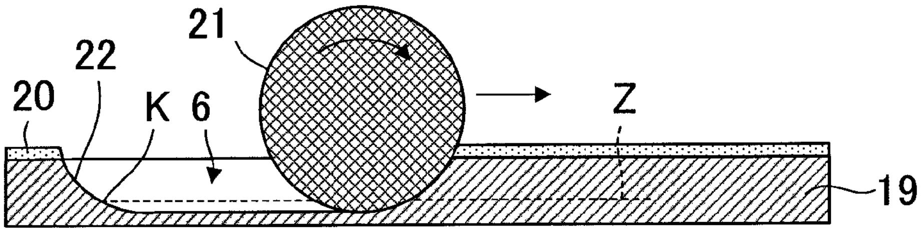
FIGS. 6A to 6D are views for explaining a groove formation step for the liquid jet head according to the third embodiment of the present invention.
Figure 6B:
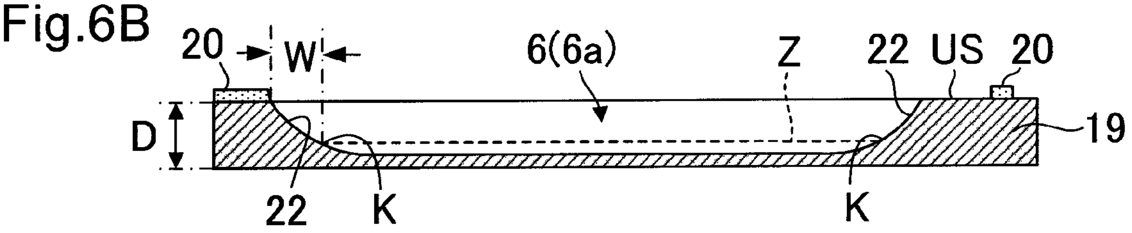
Figure 6C:
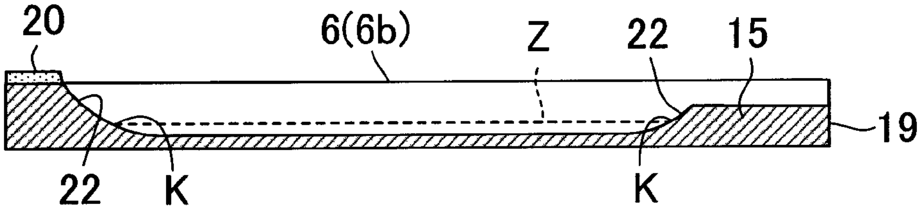
Figure 6D:
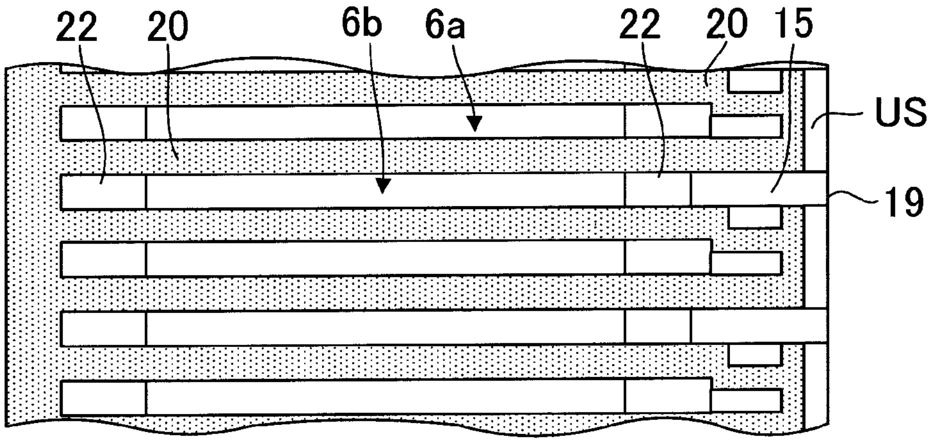

FIGS. 6A to 6D are views for explaining a groove formation step S1 for the liquid jet head 1. FIG. 6A is a schematic cross-sectional view illustrating a state in which the groove 6 is formed by a dicing blade 21. FIG. 6B is a schematic cross-sectional view of the ejection groove 6*a*. FIG. 6C is a schematic cross-sectional view of the non-ejection groove 6*b*. FIG. 6D is a schematic view of the upper surface of the piezoelectric substrate 19 in which the grooves 6 are formed. As illustrated in FIGS. 6A to 6D, the plurality of grooves 6 is formed in parallel in the piezoelectric substrate 19 in a groove formation step S1. The grooves 6 include the ejection grooves 6*a* and the non-ejection grooves 6*b*. The ejection grooves 6*a* and the non-ejection grooves 6*b* are alternately formed in parallel. The dicing blade 21 is moved downward to the ends on one side of the grooves 6, moved horizontally, and then moved upward at the ends on the other side. The piezoelectric substrate 19 is ground with the dicing blade 21 up to a depth not to reach the lower surface thereof as well as deeper than the depth of the ejection grooves 6*a* and the non-ejection grooves 6*b* indicated by broken line Z. In addition, the dicing blade 21 shallowly grinds the non-ejection grooves 6*b* at the ends on the other side toward the peripheral end of the piezoelectric substrate 19 to form the raised bottom portions 15.

By grinding the piezoelectric substrate 19 at the level deeper than the broken line Z indicating the final depth of the ejection grooves 6*a* and the non-ejection grooves 6*b*, the width W in the longitudinal direction of the inclined surfaces 22 may be reduced. That is, since the piezoelectric substrate 19 is ground by the dicing blade 21, the peripheral shape of the dicing blade 21 is transferred to the ends on one side of the ejection grooves 6*a*, the ends on the other side of the ejection grooves 6*a*, and the ends on one side of the non-ejection grooves 6*b*. For example, if grooves having a depth of 360 μm are formed by a 2-inch dicing blade 21, the inclined surfaces 22 at the ends have a width of about 4 mm in the longitudinal direction. On the other hand, if grooves having a depth of 590 μm are formed by the same dicing blade 21, the width W in the longitudinal direction of the inclined surfaces 22 to the depth of 360 μm may be reduced by half, i.e., reduced to about 2 mm. The widths of the inclined surfaces 22 at the ends on one side and the ends on the other side are reduced by 4 mm in total, whereby the number of the piezoelectric substrates 19 taken from a piezoelectric body wafer may be increased.

Here, the grooves 6 are formed such that the crossing angle is set in the range of 3 degrees to 80 degrees at the crossing portions K at which the bottom surfaces and the inclined surfaces 22 cross each other at the position as indicated by a broken line Z representing the final depth of the grooves 6. As in the above example, if the grooves 6 are formed up to a depth of 590 μm by the 2-inch dicing blade 21 so as to have a final depth of 360 μm as indicated by the broken line Z, the crossing angle between the inclined surfaces 22 and the bottom surfaces (broken line Z) is about 7.8 degrees.

Note that the crossing angle is preferably set in the range of 3 degrees to 22 degrees. If the crossing angle is less than 3 degrees, the crossing portions K become easily chipped. If the crossing angle is greater than 22 degrees, the radius of the dicing blade 21 becomes small and the grinding amount of the lower surface LS of the actuator substrate 2 is increased, which reduces workability. Hereinafter, a concrete description will be given. If grinding is performed up to a depth of 410 μm from the upper surface US by, for example, the dicing blade 21 having a radius of 36 mm such that the ejection grooves 6*a* and the non-ejection grooves 6*b* have a final depth (depth D up to the broken line Z) of 360 μm, the crossing angle is 3 degrees. In addition, if grinding is performed up to a depth of 1060 μm from the upper surface US by the dicing blade 21 having a radius of 10 mm, the crossing angle is about 22 degrees. Moreover, if grinding is performed up to a depth of 1060 μm from the upper surface US by the dicing blade 21 having a radius of 36 mm, the crossing angle is 11.3 degrees. Furthermore, if grinding is performed up to a depth of 410 mm from the upper surface US by the dicing blade 21 having a radius of 10 mm, the crossing angle is 5.7 degrees. That is, the smaller the radius of the dicing blade 21 and the deeper the grinding level from the upper surface US, the greater the crossing angle becomes.

In addition, as illustrated in FIG. 6B, the width W of the inclined surface 22 in the longitudinal direction thereof at the end on one side of the ejection groove 6*a* and the depth D up to the broken line Z are formed to satisfy the relationship $0.2 \leq (W/D) \leq 11$. If (W/D) is less than 0.2, the diameter of the dicing blade becomes small, which reduces workability such as grinding time. Moreover, the grinding amount of the lower surface LS of the actuator substrate 2 is increased, which lengthens grinding time and increases the amount of a wasted material. Furthermore, if (W/D) is greater than 11, the length of the actuator substrate 2 is increased in the direction of the grooves 6, which hinders the liquid jet head 1 from being formed in a compact size. Furthermore, the crossing portions K between the inclined surfaces 22 and the lower surface LS and portions near the crossing portions K become easily chipped, which reduces workability and hinders quality management. Note that (W/D) is preferably set to satisfy the relationship 1≤(W/D)≤11. This is because workability reduces if (W/D) is less than 1.

Figure 7A:
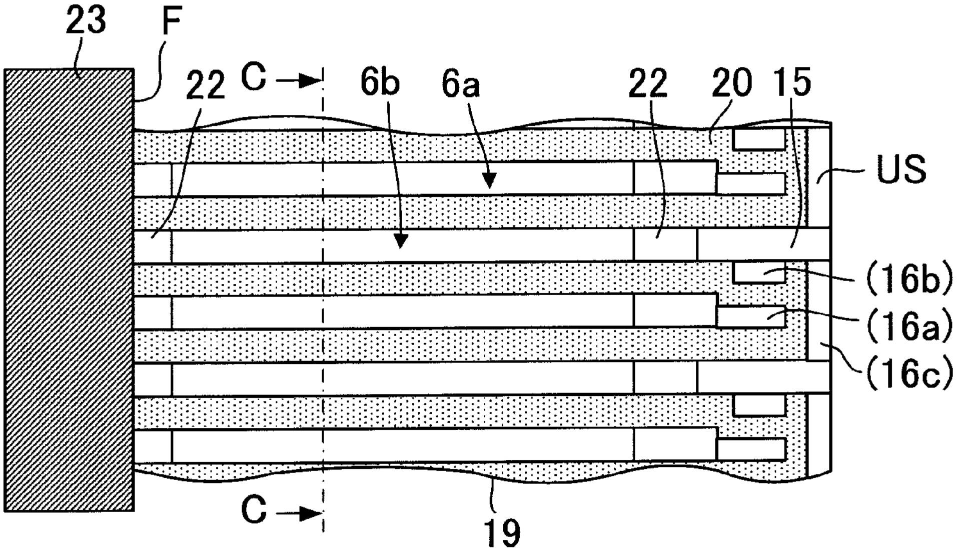
FIGS. 7A and 7B are views for explaining a mask provision step for the liquid jet head according to the third embodiment of the present invention.
Figure 7B:
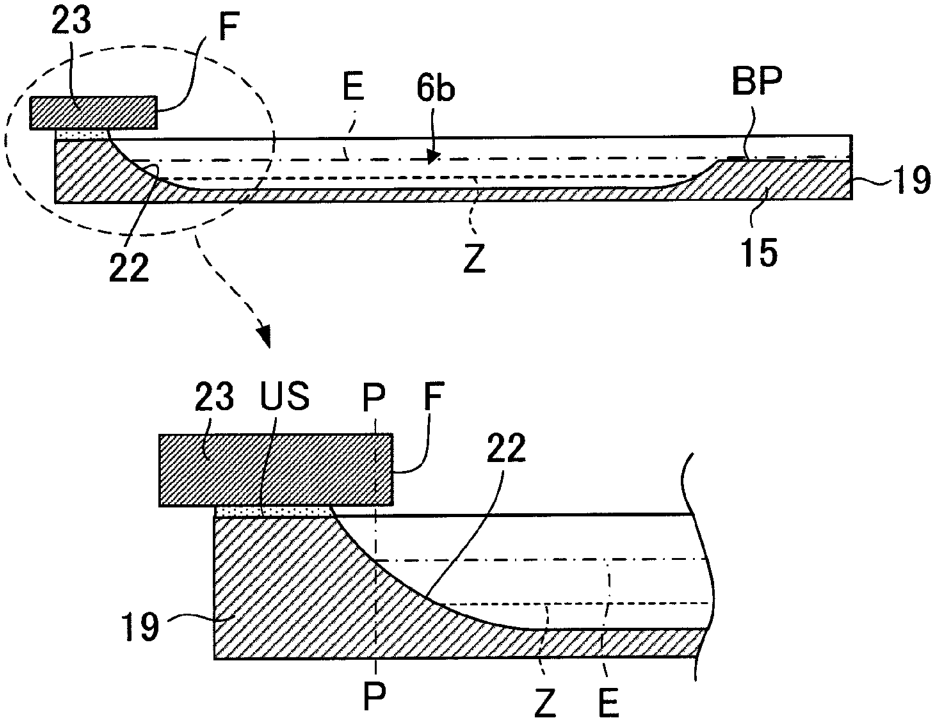

FIGS. 7A and 7B are views for explaining a mask provision step S2 for the liquid jet head 1, illustrating a state in which a mask 23 is provided at the end on one side of the piezoelectric substrate 19. FIG. 7A is a schematic view of the upper surface of the piezoelectric substrate 19. FIG. 7B is a schematic cross-sectional view along the longitudinal direction of the non-ejection groove 6*b*. As illustrated in FIGS. 7A and 7B, the mask 23 is provided on the piezoelectric substrate 19 to cover the ends on one side of the grooves 6 in a mask provision step S2. The mask 23 has an end F on the other side thereof at a position closer to the other side than the points P of the inclined surfaces 22 equal in depth to the lower ends E of the active electrodes 12*b*. The mask 23 is provided at a position to which the first slits 14*a* communicating with the ejection grooves 6*a* open to the side of the ejection grooves 6*a*. In other words, the inclined surfaces 22 shallower than the lower ends E of the active electrodes 12*b* and the upper surface US on one side are covered with the mask 23, and the ends on one side of the common electrodes 12*a* are positioned at the opening regions of the first slits 14*a* on the side of the ejection grooves 6*a*.

Figure 8:
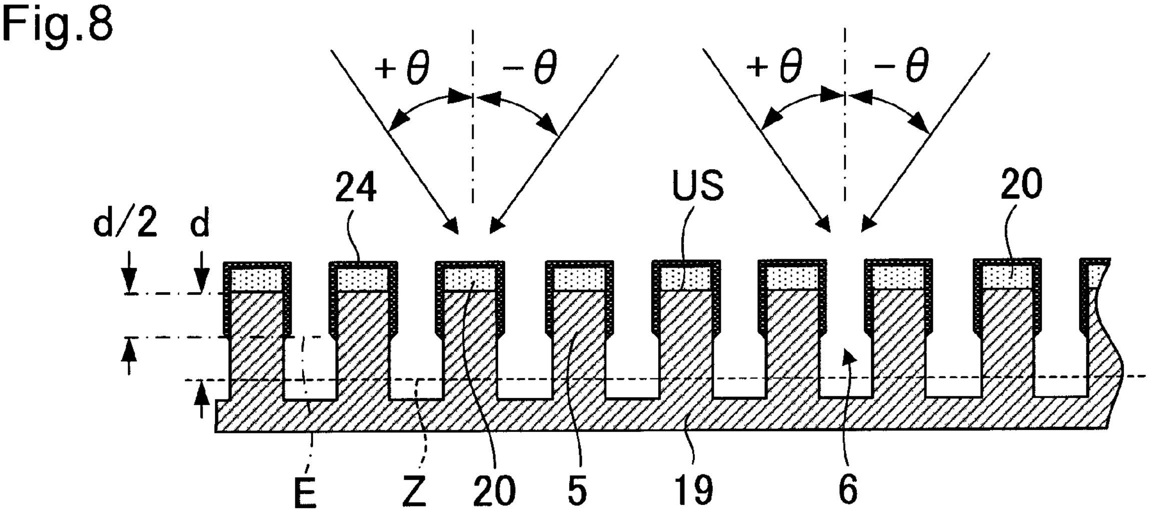
FIG. 8 is a view for explaining a conductive body accumulation step for the liquid jet head according to the third embodiment of the present invention.

FIG. 8 is a view for explaining a conductive body accumulation step S3, illustrating a state in which a conductive body 24 is accumulated according to an oblique deposition method. FIG. 8 is also a schematic cross-sectional view taken along the line C-C in FIG. 7A. In a conductive body accumulation step S3, the conductive body 24 is deposited on the upper surface US of the piezoelectric substrate 19 according to the deposition method at angles +θ and −θ inclined in a direction orthogonal to the longitudinal direction of the grooves 6 relative to the normal line of the upper surface US. In the present embodiment, the conductive body 24 is accumulated up to a depth that is approximately half a depth d between the upper surfaces US of the respective walls 5 and broken line Z, that is, up to a depth d/2. Since the inclined surfaces 22 formed at the ends on one side of the non-ejection grooves 6*b* are covered with the mask 23 at least in regions thereof shallower than the depth d/2, the conductive body 24 is not accumulated in the regions. Further, since the upper surface BP of each of the raised bottom portions 15 is positioned below the lower end E (see FIG. 7B), the conductive body 24 is not accumulated on the upper surface BP. Conversely, the conductive body 24 is accumulated on the inclined surfaces formed at the ends on the other side of the ejection grooves 6*a* in regions shallower than the depth d/2 in the same way as the upper surface US. Note that the conductive body 24 may be formed shallower than the broken line Z indicating the final depth of the grooves 6 and deeper than the depth d/2.

Figure 9:
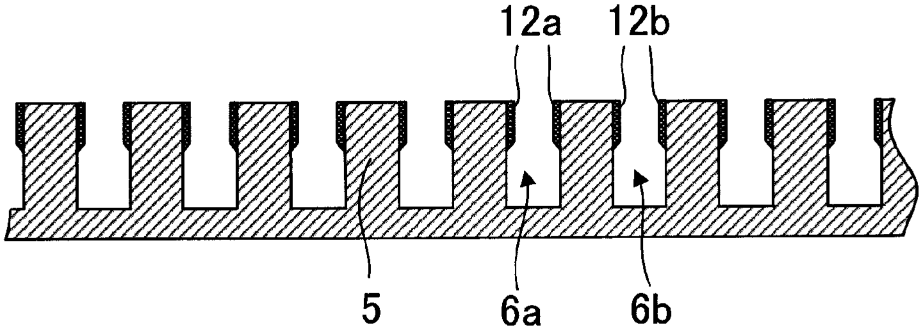
FIG. 9 is a view for explaining an electrode formation step for the liquid jet head according to the third embodiment of the present invention.

FIG. 9 is a view for explaining an electrode formation step S4, illustrating a state in which a resin film 20 and the conductive body 24 on the resin film 20 are removed at the same time. In an electrode formation step S4, the conductive body 24 is patterned to form the common electrodes 12*a* and the active electrodes 12*b*. That is, the conductive body 24 accumulated on the upper surface of the resin film 20 is removed according to a lift-off method for removing the resin film 20. Thus, the conductive body 24 accumulated on both side surfaces of the walls 5 are separated to form the common electrodes 12*a* and the active electrodes 12*b*. In the electrode formation step S4, common terminals 16*a*, active terminals 16*b*, and wirings 16*c* are also formed at the same time (see FIG. 7A). Thus, the active electrodes 12*b* formed on both side surfaces of the non-ejection grooves 6*b* are electrically separated from each other, and the common electrodes 12*a* formed on both side surfaces of the ejection grooves 6*a* are electrically connected to each other. Further, the common electrodes 12*a* are electrically connected to the respective common terminals 16*a*, and the active electrodes 12*b* are electrically connected to the respective active terminals 16*b* (see FIG. 7A). Each of the active terminals 16*b* is electrically connected to an active electrode 12*b* that is formed on the side surface of one of two walls 5 that sandwich an ejection groove 6*a* therebetween, the side surface facing a non-ejection groove 6*b*. Further, the active terminal 16*b* is electrically connected to an active electrode 12*b* that is formed on the side surface of the other one of the two walls 5, the surface facing a non-ejection groove 6*b*, via a wiring 16*c* formed along the peripheral end RE on the other side.

Note that the lower ends E of the common electrodes 12*a* and the active electrodes 12*b* formed according to the oblique deposition method are positioned at approximately ½ of the final depth d of the ejection grooves 6*a* and the non-ejection grooves 6*b* but may be positioned at a deeper level. Also in this case, the lower ends E of the common electrodes 12*a* and the active electrodes 12*b* are positioned so as not to reach the broken line Z indicating the final depth of the ejection grooves 6*a* and the non-ejection grooves 6*b*. With the common electrodes 12*a* and the active electrodes 12*b* separated from the broken line Z indicating the bottom surfaces of the ejection grooves 6*a* and the non-ejection grooves 6*b*, liquid droplets may be stably ejected.

Figure 10A:
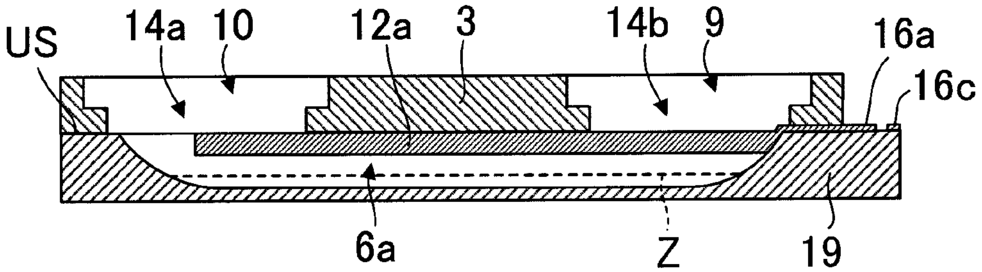
FIGS. 10A and 10B are views for explaining a cover plate provision step for the liquid jet head according to the third embodiment of the present invention.
Figure 10B:
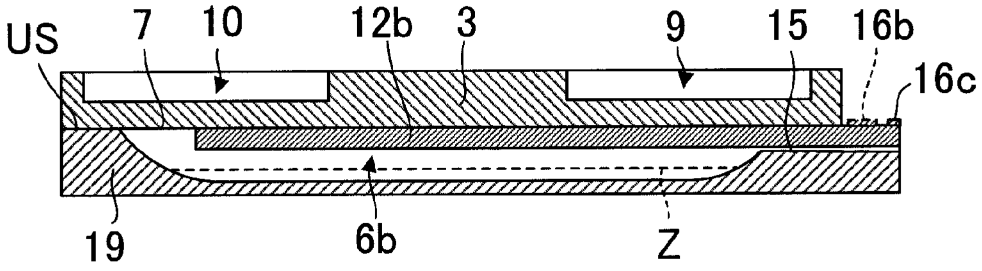

FIGS. 10A and 10B are views for explaining a cover plate provision step S5. FIGS. 10A and 10B are also schematic cross-sectional views each illustrating a state in which the cover plate 3 is provided on the piezoelectric substrate 19. FIG. 10A is a cross-sectional schematic view of the ejection groove 6*a* in the longitudinal direction thereof. FIG. 10B is a cross-sectional schematic view of the non-ejection groove 6*b* in the longitudinal direction thereof. As illustrated in FIGS. 10A and 10B, the cover plate 3 is provided on the piezoelectric substrate 19 in a cover plate provision step S5. The cover plate 3 is provided with a liquid discharge chamber 10 formed on one side and a liquid supply chamber 9 formed on the other side thereof. Further, the cover plate 3 includes first slits 14*a* which penetrate the cover plate 3 from the liquid discharge chamber 10 through a rear surface of the cover plate 3 on the opposite side of the liquid discharge chamber 10, and second slits 14*b* which penetrate the cover plate 3 from the liquid supply chamber 9 through the rear surface of the cover plate 3 on the opposite side of the liquid supply chamber 9. The liquid discharge chamber 10 communicates with the ends on one side of the ejection grooves 6*a* via the first slits 14*a*, and the liquid supply chamber 9 communicates with the ends on the other side of the ejection grooves 6*a* via the second slits 14*b*. In addition, the upper surface openings 7 of the non-ejection grooves 6*b* are blocked by the cover plate 3, and thus the non-ejection grooves 6*b* do not communicate with the liquid discharge chamber 10 or the liquid supply chamber 9.

Figure 11A:
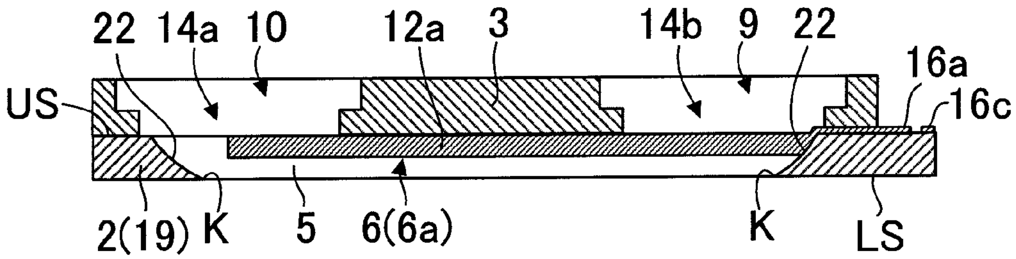
FIGS. 11A and 11B are views for explaining a piezoelectric substrate grinding step for the liquid jet head according to the third embodiment of the present invention.
Figure 11B:
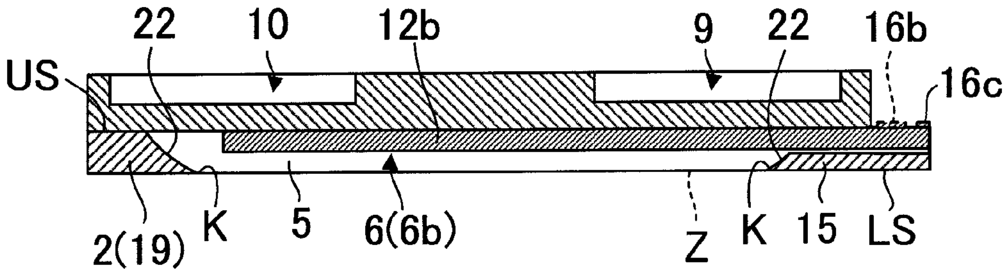

FIGS. 11A and 11B are views for explaining a piezoelectric substrate grinding step S6, illustrating a state in which the rear surface of the piezoelectric substrate 19 on a side opposite to the cover plate 3 is ground. FIG. 11A is a schematic cross-sectional view of the ejection groove 6*a* in the longitudinal direction thereof. FIG. 11B is a schematic cross-sectional view of the non-ejection groove 6*b* in the longitudinal direction thereof. As illustrated in FIGS. 11A and 11B, the piezoelectric substrate 19 on the side opposite to the side thereof where the grooves 6 are formed is ground to make the grooves 6 penetrate the piezoelectric substrate 19 from the upper surface US to the lower surface LS to form the actuator substrate 2 in a piezoelectric substrate grinding step S6. The rear surface of the piezoelectric substrate 19 is ground to the broken line Z indicating the final depth of the grooves 6. Thus, the crossing angle at the crossing portions K at which the inclined surfaces 22 and the lower surface LS cross each other is set in the range of 3 degrees to 80 degrees. Since the upper surface US of the walls 5 is fixed by the cover plate 3 and the piezoelectric substrate 19 remains at the ends on one side of the grooves 6 and the ends on the other side thereof including the raised bottom portions 15, breakage may be prevented upon grinding of the piezoelectric substrate 19. In addition, since the crossing angle $\phi$ at the crossing portions K is greater than 3 degrees, tip ends near the crossing portions K between the inclined surfaces 22 and the lower surface LS are prevented from becoming chipped, which improves workability. Moreover, since the crossing angle is less than 80 degrees, it is possible to cut the amount of a wasted material and shorten grinding time with a reduction in the grinding and removing amount of the piezoelectric substrate 19. Note that the crossing angle at the crossing portions K is preferably set in the range of 3 degrees to 22 degrees. This is because workability reduces if the crossing angle is greater than 22 degrees.

Furthermore, in the piezoelectric substrate grinding step S6, the lower surface LS of the piezoelectric substrate 19 is ground such that the width of the inclined surfaces 22 of the ejection grooves 6*a* or the non-ejection grooves 6*b* in the longitudinal direction thereof and the thickness D (see FIG. 6D) of the piezoelectric substrate 19 satisfy the relationship $0.2 \leq (W/D) \leq 11$ at the ends on one side of the ejection grooves 6*a* or the non-ejection grooves 6*b*. If (W/D) is less than 0.2, the diameter of the dicing blade becomes small, which reduces workability such as grinding time. Note that (W/D) is preferably set to satisfy the relationship $1 \leq (W/D) \leq 11$. This is because workability reduces if (W/D) is less than 1.

Figure 12A:
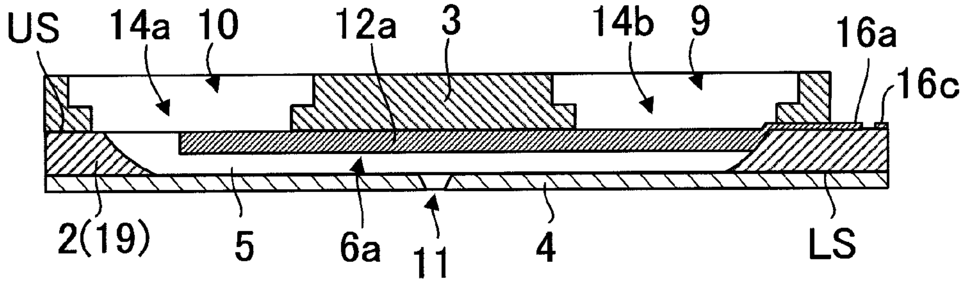
FIGS. 12A and 12B are views for explaining a nozzle plate provision step for the liquid jet head according to the third embodiment of the present invention.
Figure 12B:
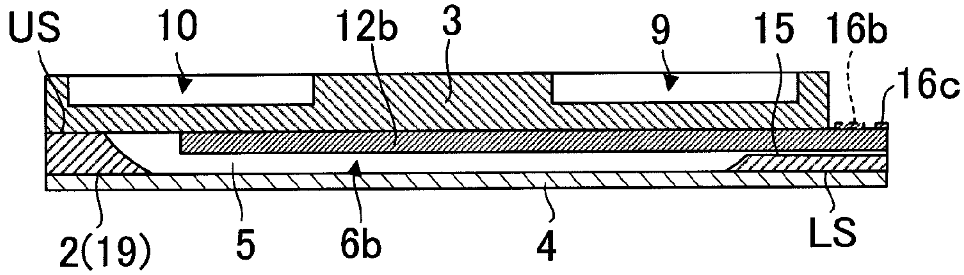
Figure 15A:
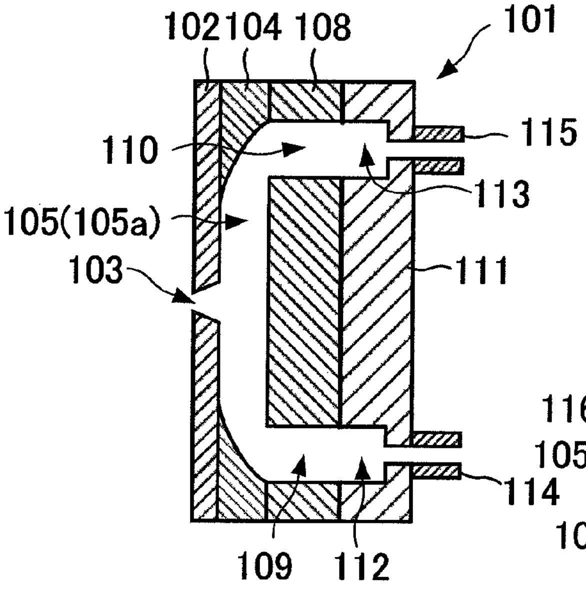
Fig.15A prior art
FIGS. 15A and 15B are cross-sectional schematic views of a conventionally-known liquid jet head.
Figure 15B:
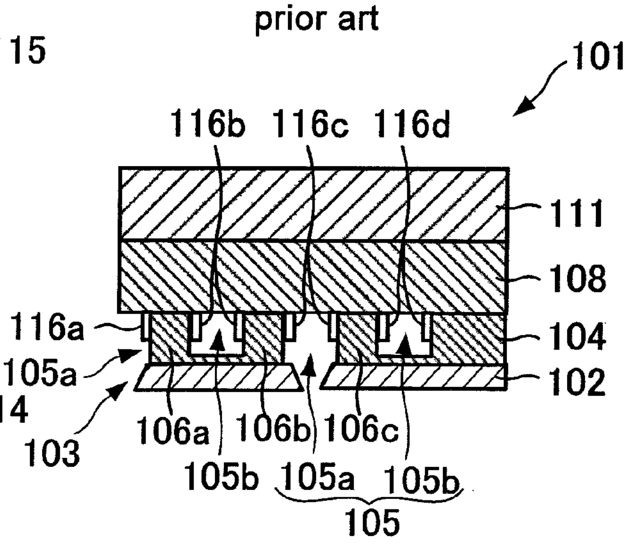
Fig.15B prior art

FIGS. 12A and 12B are views for explaining a nozzle plate provision step S7, each illustrating a state in which the nozzle plate 4 is adhered to the lower surface LS of the actuator substrate 2 (piezoelectric substrate 19). FIG. 12A is a schematic cross-sectional view of the ejection groove 6*a* in the longitudinal direction thereof. FIG. 12B is a schematic cross-sectional view of the non-ejection groove 6*b* in the longitudinal direction thereof. As illustrated in FIGS. 12A and 12B, in a nozzle plate provision step S7, the nozzle plate 4 is provided on the lower surface LS of the piezoelectric substrate 19. The nozzle plate 4 has the nozzles 11 opening therein, and the nozzles 11 communicate with the ejection grooves 6*a*. The nozzle plate 4 is lower in stiffness than the cover plate 3.

According to the above manufacturing method, the active electrodes 12*b* formed on both side surfaces of the non-ejection grooves 6*b* may be electrically separated from each other in a lump. Therefore, it is not necessary to separate the conductive body formed on the upper surface of the walls 5 into pieces, which makes the manufacturing method very simple. In addition, the width of the inclined surfaces 22 formed at the ends of the respective grooves 6 may be reduced. Therefore, with an increase in the number of the piezoelectric substrates 19 taken from a piezoelectric body wafer, the manufacturing cost may be reduced.

Note that in the piezoelectric substrate 19, at least the walls 5 partitioning the respective grooves 6 may be made of piezoelectric bodies, and portions other than the walls 5 may be made of insulation bodies composed of non-piezoelectric bodies. Further, as described in the first embodiment, the non-ejection grooves 6*b* (or also the ejection grooves 6*a*) can be formed so that the material of the actuator substrate 2 is left on the bottoms thereof. The nozzle plate 4 is not necessarily a single layer, and can therefore include a plurality of thin film layers of different materials. Further, in the present embodiment, the common electrodes 12*a*, the active electrodes 12*b*, the common terminals 16*a*, and the active terminals 16*b* are patterned according to the lift-off method. However, the present invention is not limited to this. For example, the patterns of the common electrodes 12*a*, the active electrodes 12*b*, the common terminals 16*a*, and the active terminals 16*b* may also be formed by photolithography and etching after the conductive body 24 is formed on the upper surface US of the piezoelectric substrate 19 and the side surfaces of the walls 5 by oblique deposition in the conductive body accumulation step S3 (FIG. 8). Further, the piezoelectric substrate grinding step S6 can be omitted. Specifically, the grooves 6 may be formed in the following manner. The thickness of the piezoelectric substrate 19 is set to be approximately the same as the final depth of the grooves 6. Further, in the groove formation step S1 illustrated in FIGS. 6A to 6D, the piezoelectric substrate 19 is deeply ground with the dicing blade 21 so that the dicing blade 21 penetrates the lower surface of the piezoelectric substrate 19 to form the lower surface openings 8 thereon, and, at the same time, the raised bottom portions 15 are left on the piezoelectric substrate 19.

Fourth Embodiment

FIGS. 13A to 13C are views for explaining the groove formation step S1 for the liquid jet head 1 according to a fourth embodiment of the present invention. The fourth embodiment is different from the third embodiment in that, in the groove formation step S1, the grooves 6 are formed in such a way as to provide the piezoelectric substrate 19 having a board thickness equivalent to the final depth of the grooves 6 and the piezoelectric substrate grinding step S6 is eliminated. Other than this point, the steps of the fourth embodiment are the same as those of the third embodiment. Accordingly, a description will be given of the different step below. In addition, the same portions or portions having the same functions as those of the first embodiment will be denoted by the same symbols.

FIG. 13A is a schematic cross-sectional view illustrating a state in which the groove 6 is formed by the dicing blade 21. FIG. 13B is a schematic cross-sectional view of the ejection groove 6*a*. FIG. 13C is a schematic cross-sectional view of the non-ejection groove 6*b*. As illustrated in FIGS. 13A to 13C, in the groove formation step S1, the plurality of grooves 6 is formed in parallel in the piezoelectric substrate 19 having the board thickness of the actuator substrate 2. The grooves 6 include the ejection grooves 6*a* and the non-ejection grooves 6*b*. The ejection grooves 6*a* and the non-ejection grooves 6*b* are alternately formed in parallel. The dicing blade 21 is moved downward to the ends on one side of the grooves 6, moved horizontally, and then moved upward at the ends on the other side. The dicing blade 21 penetrates the lower surface LS of the piezoelectric substrate 19 to form the upper surface openings 7 in the upper surface US of the piezoelectric substrate 19 and form the lower surface openings 8 in the lower surface LS thereof. In addition, the dicing blade 21 shallowly grinds the non-ejection grooves 6*b* at the ends on the other side toward the peripheral end of the piezoelectric substrate 19 to form the raised bottom portions 15.

By grinding the piezoelectric substrate 19 to form the ejection grooves 6*a* and the non-ejection grooves 6*b* at a level deeper than the board thickness of the piezoelectric substrate 19, it is possible to reduce the width W of the inclined surfaces 22 in the longitudinal direction. That is, since the piezoelectric substrate 19 is ground by the dicing blade 21, the peripheral shape of the dicing blade 21 is transferred to the ends on one side of the ejection grooves 6*a*, the ends on the other side of the ejection grooves 6*a*, the ends on one side of the non-ejection grooves 6*b*, and the ends of the raised bottom portions 15 on the other side of the non-ejection grooves 6*b*. For example, if grooves having a depth of 360 μm are formed by a 2-inch dicing blade 21, the inclined surfaces 22 at the ends have a width of about 4 mm in the longitudinal direction. On the other hand, if grooves having a depth of 590 μm are formed by the same dicing blade 21, the width W in the longitudinal direction of the inclined surfaces 22 to the depth of 360 μm may be reduced by half, i.e., reduced to about 2 mm. The widths of the inclined surfaces 22 at the ends on one side and the ends on the other side are reduced by 4 mm in total, whereby the number of the piezoelectric substrates 19 taken from a piezoelectric body wafer may be increased.

The grooves 6 are formed such that the crossing angle between the inclined surfaces 22 and the lower surface LS at the crossing portions K at which the center lines of the inclined surfaces 22 in the groove width direction thereof and the lower surface LS cross each other is set in the range of 3 degrees to 80 degrees. Moreover, the crossing angle between the inclined surfaces 22 and the lower surface LS is preferably set in the range of 3 degrees to 22 degrees. The reason for this is omitted here as it is described above. As in the above example, if the grooves 6 having a depth of 590 μm are formed by the 2-inch dicing blade 21 in the piezoelectric substrate having a board thickness of 360 μm, the crossing angle $\phi$ between the inclined surfaces 22 and the lower surface LS is approximately 7.8 degrees.

In addition, in the groove formation step S1, the grooves 6 are formed such that the width W of the inclined surfaces 22 of the ejection groove 6*a* or the non-ejection grooves 6*b* in the longitudinal direction thereof and the thickness D of the piezoelectric substrate 19 satisfy the relationship 0.2 (W/D) 11 at the ends on one side of the ejection grooves 6*a* or the non-ejection grooves 6*b*. Moreover, the grooves 6 are preferably formed to satisfy the relationship 1≤(W/D)≤11. The reason for this is omitted here as it is described above.

Since the mask provision step S2, the conductive body accumulation step S3, the cover plate provision step S5, and the nozzle plate provision step S7 that will be successively performed are the same as those of the third embodiment, their descriptions will be omitted.

Fifth Embodiment

FIG. 14 is a schematic perspective view of a liquid jet apparatus 30 according to a fifth embodiment of the present invention. The liquid jet apparatus 30 includes a moving mechanism 40 that reciprocates liquid jet heads 1 and 1', flow path sections 35 and 35' that supply liquid to the liquid jet heads 1 and 1' and discharge the liquid from the liquid jet heads 1 and 1', and liquid pumps 33 and 33' and liquid tanks 34 and 34' that communicate with the flow path sections 35 and 35'. The respective liquid jet heads 1 and 1' have a plurality of head chips. The respective head chips have channels composed of a plurality of ejection grooves and eject liquid droplets from nozzles communicating with the respective channels. As the liquid pumps 33 and 33', either or both of supply pumps which supply liquid to the flow path sections 35 and 35' and discharge pumps which discharge liquid to components other than the flow path sections 35 and 35' are provided. In addition, a pressure sensor and a flow rate sensor (not shown) may be provided to control the flow rate of the liquid. The liquid jet heads 1 and 1' used here are those described in the first or the second embodiment.

The liquid jet apparatus 30 includes a pair of conveyance units 41 and 42 that conveys a recording medium 44 such as a paper in a main scanning direction; the liquid jet heads 1 and 1' that eject the liquid onto the recording medium 44; a carriage unit 43 that has the liquid jet heads 1 and 1' mounted thereon; the liquid pumps 33 and 33' that supply the liquid stored in the liquid tanks 34 and 34' to the flow path sections 35 and 35' under pressure; and the moving mechanism 40 that causes the liquid jet heads 1 and 1' to scan in a sub-scanning direction orthogonal to the main scanning direction. A control unit (not shown) controls and drives the liquid jet heads 1 and 1', the moving mechanism 40, and the conveyance units 41 and 42.

The pair of conveyance units 41 and 42 extends in the sub-scanning direction and has grid rollers and pinch rollers that rotate with the roller surfaces thereof coming in contact with each other. The grid rollers and the pinch rollers are caused to rotate about the shafts thereof by a motor (not shown) to convey the recording medium 44 held between the rollers in the main scanning direction. The moving mechanism 40 includes a pair of guide rails 36 and 37 that extend in the sub-scanning direction; the carriage unit 43 slidable along the pair of guide rails 36 and 37; an endless belt 38 that is connected to the carriage unit 43 and moves the carriage unit 43 in the sub-scanning direction; and a motor 39 that revolves the endless belt 38 via pulleys (not shown).

The carriage unit 43 has the plurality of liquid jet heads 1 and 1' mounted thereon and ejects, for example, four types of liquid droplets of yellow, magenta, cyan, and black. The liquid tanks 34 and 34' store the liquids of corresponding colors and supply the same to the liquid jet heads 1 and 1' via the liquid pumps 33 and 33' and the flow path sections 35 and 35'. The respective liquid jet heads 1 and 1' eject liquid droplets of the respective colors in response to a drive signal. With the control of timing for ejecting the liquid from the liquid jet heads 1 and 1', the rotation of the motor 39 that drives the carriage unit 43, and the conveyance speed of the recording medium 44, any pattern may be recorded on the recording medium 44.

Note that in the liquid jet apparatus 30 according to the present embodiment, the moving mechanism 40 moves the carriage unit 43 and the recording medium 44 to perform recording. Alternatively, a liquid jet apparatus may be used in which a moving mechanism two-dimensionally moves a recording medium to perform recording with a carriage unit fixed. That is, the moving mechanism may have any configuration as long as it can move liquid jet heads and a recording medium relative to each other.

What is claimed is:

1. A liquid jet head, comprising:

an actuator substrate having a plurality of elongated grooves arrayed from an upper surface to a lower surface thereof, wherein the grooves are formed from a vicinity of a peripheral end on one side of the actuator substrate to the other side thereof, ends of the grooves in a longitudinal direction thereof have respective inclined surfaces rising from the lower surface to the upper surface of the actuator substrate, a crossing angle at crossing portions at which the inclined surfaces and the lower surface cross each other is in a range of 3 degrees to 80 degrees, and a width W of the inclined surfaces in the longitudinal direction thereof and a thickness D of the actuator substrate satisfy a relationship 0.2≤(W/D)≤11 at the ends on one side of the grooves.

2. The liquid jet head according to claim 1, wherein the grooves include respective alternately-arrayed ejection grooves and non-ejection grooves.

3. The liquid jet head according to claim 2, wherein the ejection grooves are formed from the vicinity of the peripheral end on one side of the actuator substrate to a vicinity of a peripheral end on the other side thereof, the non-ejection grooves are extended from the vicinity of the peripheral end on one side of the actuator substrate to the peripheral end on the other side thereof and have respective raised bottom portions, each of which is a remainder of the actuator substrate, on bottoms thereof near the peripheral end on the other side, and ends on one side of the raised bottom portions have the respective inclined surfaces rising from the lower surface of the actuator substrate to upper surfaces of the raised bottom portions, the inclined surfaces constituting the ends of the non-ejection grooves in the longitudinal direction thereof.

4. The liquid jet head according to claim 2, further comprising:

a cover plate provided to partially cover upper surface openings of the ejection grooves and the non-ejection grooves and having first slits communicating with one side of the ejection grooves and second slits communicating with the other side thereof; and a nozzle plate provided to cover lower surface openings of the ejection grooves and the non-ejection grooves and having nozzles communicating with the ejection grooves.

5. The liquid jet head according to claim 4, wherein opening portions opened to a side of the ejection grooves of the first and second slits are provided at positions at which the opening portions partially overlap the lower surface openings.

6. A liquid jet apparatus, comprising:

the liquid jet head according to claim 1;

a moving mechanism configured to move the liquid jet head and a recording medium relative to each other;

a liquid supply tube configured to supply liquid to the liquid jet head; and a liquid tank configured to supply the liquid to the liquid supply tube.

7. A method of manufacturing a liquid jet head, comprising:

a groove formation step of forming a plurality of grooves in parallel in a piezoelectric substrate and forming inclined surfaces rising from bottom surfaces of the grooves to an upper surface of the piezoelectric substrate at ends of the grooves in a longitudinal direction thereof;

a conductive body accumulation step of accumulating a conductive body on the piezoelectric substrate;

an electrode formation step of patterning the conductive body to form electrodes;

a cover plate provision step of providing a cover plate on the upper surface of the piezoelectric substrate;

a piezoelectric substrate grinding step of grinding a lower surface on a side opposite to the upper surface of the piezoelectric substrate to set a crossing angle at crossing portions, at which the inclined surfaces and the lower surface cross each other, in a range of 3 degrees to 80 degrees, and grinding the lower surface of the piezoelectric substrate such that a width W of the inclined surfaces of the grooves in the longitudinal direction thereof and a thickness D of the piezoelectric substrate satisfy a relationship $0.2 \leq (W/D) \leq 11$ at ends on one side of the grooves;

a nozzle plate provision step of providing a nozzle plate below the piezoelectric substrate.

8. The method of manufacturing the liquid jet head according to claim 7, wherein the groove formation step includes alternately forming ejection grooves and non-ejection grooves.

9. The method of manufacturing the liquid jet head according to claim 7, wherein the groove formation step includes alternately forming ejection grooves and non-ejection grooves.

* * * * *